(12) United States Patent
Murooka

(10) Patent No.: US 8,565,007 B2
(45) Date of Patent: Oct. 22, 2013

(54) SEMICONDUCTOR MEMORY DEVICE

(71) Applicant: Kabushiki Kaisha Toshiba, Minato-ku (JP)

(72) Inventor: Kenichi Murooka, San Jose, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/764,274

(22) Filed: Feb. 11, 2013

(65) Prior Publication Data

US 2013/0148399 A1 Jun. 13, 2013

Related U.S. Application Data

(62) Division of application No. 13/051,574, filed on Mar. 18, 2011, now Pat. No. 8,406,034.

(30) Foreign Application Priority Data

Jun. 8, 2010 (JP) ................... 2010-130673

(51) Int. Cl.
*G11C 11/00* (2006.01)
(52) U.S. Cl.
USPC ................. 365/148; 365/72; 365/63; 365/46; 365/51
(58) Field of Classification Search
USPC .................... 365/148, 63, 72, 46, 51
See application file for complete search history.

(56) References Cited

U.S. PATENT DOCUMENTS

| | | | |
|---|---|---|---|
| 7,724,562 B2 | 5/2010 | Meyer et al. | |
| 7,990,752 B2 | 8/2011 | Asao | |
| 8,014,189 B2 | 9/2011 | Tsukamoto et al. | |
| 8,023,318 B2 | 9/2011 | Hwang et al. | |
| 8,094,482 B2 | 1/2012 | Wei et al. | |
| 8,115,245 B2 * | 2/2012 | Yoshimizu et al. | 257/315 |
| 8,216,862 B2 | 7/2012 | Kreupl et al. | |
| 8,254,160 B2 | 8/2012 | Murooka et al. | |
| 8,270,202 B2 | 9/2012 | Scheuerlein | |
| 8,295,077 B2 | 10/2012 | Murooka | |
| 8,369,127 B2 * | 2/2013 | Maejima | 365/148 |
| 8,406,034 B2 * | 3/2013 | Murooka | 365/148 |
| 8,441,839 B2 * | 5/2013 | Azuma et al. | 365/148 |

FOREIGN PATENT DOCUMENTS

| | | |
|---|---|---|
| JP | 2008-160004 | 7/2008 |
| JP | 2009-500867 | 1/2009 |
| JP | 2010-9669 | 1/2010 |

* cited by examiner

*Primary Examiner* — Viet Q Nguyen
(74) *Attorney, Agent, or Firm* — Oblon, Spivak, McClelland, Maier & Neustadt, L.L.P.

(57) ABSTRACT

A semiconductor memory device in accordance with an embodiment includes a plurality of first word lines, a plurality of bit lines, a resistance varying material, a plurality of second word lines and an insulating film. The bit lines intersect the first word lines. The resistance varying material is disposed at respective intersections of the first word lines and the bit lines. The second word lines intersect the bit lines. The insulating film is disposed at respective intersections of the second word lines and the bit lines. One of the first word lines and one of the second word lines are disposed so as to sandwich the bit lines. The second word lines, the bit lines, and the insulating film configure a field-effect transistor at respective intersections of the second word lines and the bit lines. The field-effect transistor and the resistance varying material configure one memory cell.

13 Claims, 15 Drawing Sheets

SEMICONDUCTOR MEMORY DEVICE

CROSS REFERENCE TO RELATED APPLICATIONS

This application is a divisional of U.S. application Ser. No. 13/051,574 filed Mar. 18, 2011 now U.S. Pat. No. 8,406,034, and is based upon and claims the benefit of priority from prior Japanese Patent Application No. 2010-130673, filed on Jun. 8, 2010, the entire contents of each of which are incorporated herein by reference.

BACKGROUND

1. Field

The embodiments described herein relate to a semiconductor memory device.

2. Description of the Related Art

In recent years, along with a rising level of integration in semiconductor devices, circuit patterns of LSI elements configuring these semiconductor devices are being increasingly miniaturized. Required in this miniaturization of the patterns is not simply a thinning of line width but also an improvement in dimensional accuracy and positioning accuracy of the patterns. Semiconductor memory devices are no exception to this trend, and, in memory cells formed utilizing high precision processing technologies, there is a continued requirement to store the certain charge necessary for memory in an ever narrower region of the memory cells.

Conventionally, various kinds of memories such as DRAM, SRAM, and flash memory are manufactured, all of which use a MOSFET as a memory cell. These memories require, along with miniaturization of the patterns, an improvement in dimensional accuracy and positioning accuracy at a rate that exceeds a rate of the miniaturization. A large burden is placed additionally on lithography technology, which is used to form the patterns. Lithography processing costs account for the vast majority of current costs of mass production. The requirement for miniaturization of the patterns is a factor causing to a rise in lithography processing costs, that is, to a rise in product cost.

At the same time, in recent years, a memory known as a resistance varying memory (ReRAM: Resistive RAM) is proposed as a technology for overcoming such problems, a memory cell in the ReRAM being configured by a selection element, which comprises a non-ohmic element typified by a diode, and a resistance varying material. This ReRAM does not utilize storage of a charge in data retention and can be configured without using a MOSFET as a memory cell, and is thus expected to allow high levels of integration exceeding those of conventional trends to be achieved. Arranging the memory cell array of the ReRAM three-dimensionally in stacks makes it possible to realize a large capacity in the ReRAM without increasing cell array area.

Moreover, the ReRAM allows a high density memory cell array to be realized by provision of a cross-point type structure in which a resistance varying material and a rectifier such as a diode are disposed at intersections of bit lines and word lines. However, there is a risk that, when reading data from this kind of ReRAM, if it is attempted to pass a read current through a memory cell to detect a resistance value, a resistance state of the resistance varying material in the memory cell is changed by this read current. There is thus a problem that, during a read operation, accurate data cannot be read from the memory cell.

DETAILED DESCRIPTION

A semiconductor memory device in accordance with an embodiment comprises a plurality of first word lines, a plurality of bit lines, and a resistance varying material. The plurality of first word lines extend in a first direction and are arranged having a certain pitch in a second direction orthogonal to the first direction. The plurality of bit lines extend in the second direction, are arranged having a certain pitch in the first direction, and intersect the first word lines such that a first surface of the bit lines faces the first word lines. The resistance varying material is disposed at respective intersections of the first word lines and the bit lines. In addition, the semiconductor memory device comprises a plurality of second word lines and an insulating film. The plurality of second word lines extend in the first direction, are arranged having a certain pitch in the second direction, and intersect the bit lines so as to face a second surface of the bit lines, the second surface of the bit lines being on an opposite side of the first surface of the bit lines. The insulating film is disposed at respective intersections of the second word lines and the bit lines. One of the first word lines and one of the second word lines have a position substantially identical in the second direction and are disposed so as to sandwich the bit lines. The second word lines, the bit lines, and the insulating film configure a field-effect transistor at respective intersections of the second word lines and the bit lines, the field-effect transistor having one of the second word lines as a control electrode and one of the bit lines as a channel region. The field-effect transistor and the resistance varying material configure one memory cell.

Embodiments of a semiconductor memory device in accordance with the present invention are described below with reference to the drawings.

First Embodiment

Figure 1:
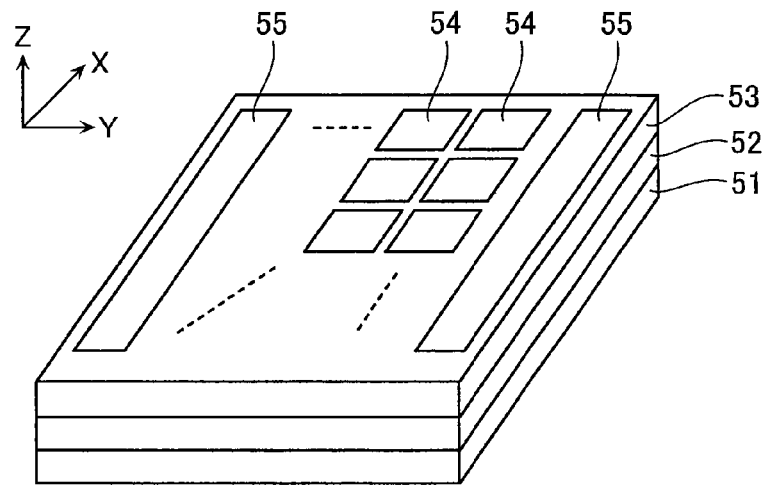
FIG. 1 is a perspective view showing an overall configuration of a semiconductor memory device in accordance with a first embodiment.

Configuration of Semiconductor Memory Device in Accordance with First Embodiment FIG. 1 is a perspective view showing an overall configuration of a semiconductor memory device in accordance with a first embodiment. Formed on an ordinary silicon (Si) substrate 51 (semiconductor substrate) by generally used processes is a CMOS circuit 52 including a wiring layer. Formed on the CMOS circuit 52 by generally used processes is a layer 53 including a plurality of memory cell units 54.

The CMOS circuit 52 is designed and produced with, for example, a 90 nm design rule which is looser than that for wirings of the memory cell unit 54 except for a connecting portion with the memory cell unit 54. One memory cell unit 54 occupies an approximately 11 μm square region, and includes intersections of 256×256 lines. Provided in a periphery of each memory cell unit 54 is an electrical connecting portion with the CMOS circuit 52 (not shown). Blocks, each comprising the memory cell unit 54 and peripheral electrical connecting portion as one unit, are disposed in a matrix. Furthermore, the layer 53 which includes the memory cell units 54 is provided with through-holes (not shown). The electrical connecting portions of the memory cell units 54 are connected to the CMOS circuit 52 via the through-holes. Operation of the memory cell units 54 is controlled by the CMOS circuit 52. An input/output unit 55 of the semiconductor memory device includes terminals having electrical coupling with an input/output unit of the CMOS circuit 52. These terminals also are connected to the input/output unit of the CMOS circuit 52 via the aforementioned through-holes. Data, commands, addresses, and so on, required by the CMOS circuit 52 for controlling operation of the memory cell units 54 are exchanged with external via the input/output unit 55. The input/output unit 55 is formed at an end of the layer 53 including the memory cell units 54 (refer to FIG. 1).

Such a configuration enables an insulating film formed in the memory cell unit 54 to serve as a protective film of the CMOS circuit 52. In addition, since the memory cell units 54 and the CMOS circuit 52 in the present embodiment are coupled in a stacking direction, it becomes possible to reduce operating time and significantly increase a number of memory cells capable of simultaneous read/write, without an accompanying increase in chip area. Note that the input/output unit 55 of the memory device is bonded to a lead frame in a packaging process, similarly to a conventional semiconductor memory device.

Figure 2:
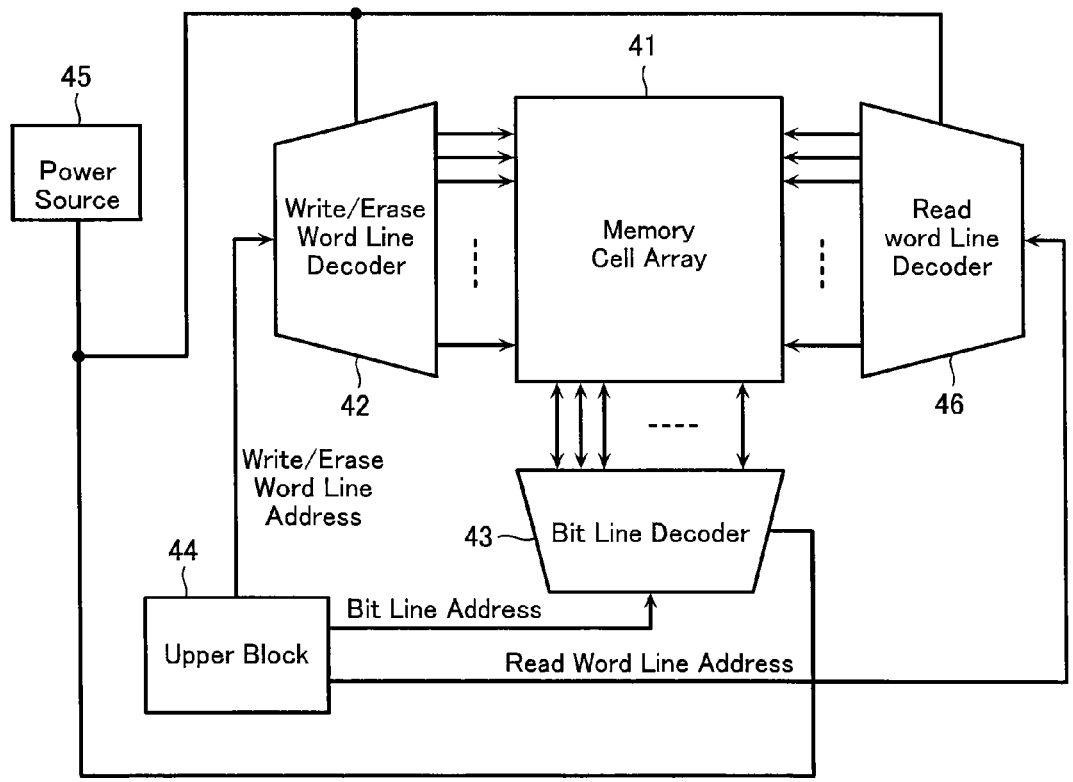
FIG. 2 is a block diagram of the semiconductor memory device in accordance with the first embodiment.

FIG. 2 is a block diagram of the semiconductor memory device in accordance with the present embodiment. The semiconductor memory device includes a memory cell array 41, the memory cell array 41 including a plurality of row lines and a plurality of column lines intersecting these row lines, and having memory cells disposed at respective intersections of the row lines and column lines. The memory cell unit 54 shown in FIG. 1 corresponds to this memory cell array 41. In the following description, the row lines are referred to as word lines and the column lines are referred to as bit lines, in accordance with a conventional semiconductor memory device. The semiconductor memory device of the present embodiment is provided with two kinds of word lines, namely, write/erase word lines (first word lines) employed in write/erase operations of data to/in the memory cells, and read word lines (second word lines) employed in a read operation of data from the memory cells. Disposition of the write/erase word lines, read word lines, and bit lines within the memory cell array 41 is described later.

In addition, the semiconductor memory device comprises: a write/erase word line decoder 42 for selecting the write/erase word lines during the write/erase operations; a bit line decoder 43 for selecting the bit lines; and a read word line decoder 46 for selecting the read word lines during the read operation. The bit line column decoder 43 includes drivers for controlling read, write, and erase operations. Moreover, the semiconductor memory device comprises an upper block 44 which is a control circuit for selecting the memory cells subject to read and write in the memory cell array 41. The upper block 44 supplies a write/erase word line address, a bit line address, and a read word line address to the write/erase word line decoder 42, the bit line decoder 43, and the read word line decoder 46, respectively. A power source 45 generates combinations of certain voltages for handling the respective operations of read, write, and erase, and supplies these voltages to the write/erase word line decoder 42, the bit line decoder 43, and the read word line decoder 46. This configuration makes it possible to read, write, and erase information in all memory cells connected to an identical word line in one lot. Circuits referred to as peripheral circuits, each including the write/erase word line decoder 42, the bit line decoder 43, the read word line decoder 46, and the upper block 44 of FIG. 2, are provided in the CMOS circuit 52 shown in FIG. 1.

Figure 3A:
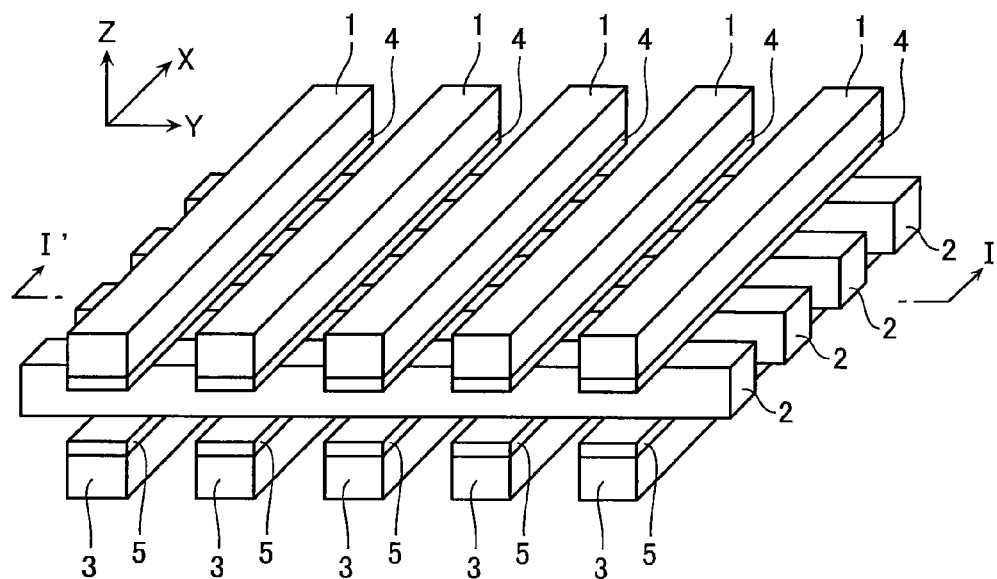
FIG. 3A is a perspective view showing a part of a memory cell array in the semiconductor memory device in accordance with the first embodiment.
Figure 3B:
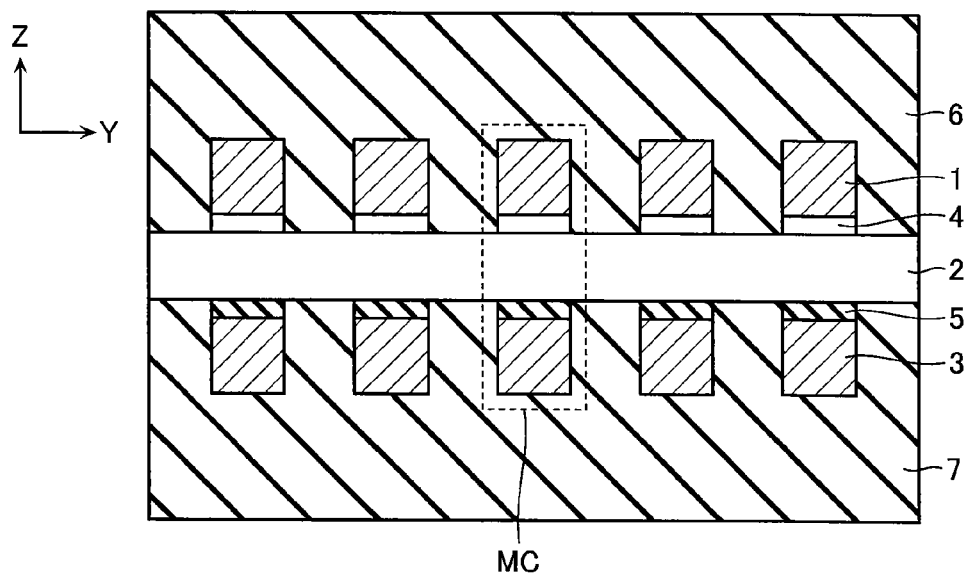
FIG. 3B is a cross-sectional view showing a part of the memory cell array in the semiconductor memory device in accordance with the first embodiment.

FIGS. 3A and 3B are, respectively, a perspective view and a cross-sectional view showing part of the memory cell array 41 shown in FIG. 2. FIG. 3B is a cross-sectional view taken along the line I-I' of FIG. 3A. Note that, in FIGS. 3A and 3B, the memory cell array 41 is isolated from the semiconductor substrate 51 (not shown), which is in a lower portion in a Z direction, by an interlayer insulating film 7. Interlayer insulating films 6 and 7 are omitted from FIG. 3A.

As shown in FIGS. 3A and 3B, the memory cell array is provided with a plurality of write/erase word lines 1 extending in an X direction (first direction) and arranged having a certain pitch in a Y direction (second direction). In addition, the memory cell 41 is provided with a plurality of bit lines 2 extending in the Y direction and arranged having a certain pitch in the X direction. The write/erase word lines 1 and the bit lines 2 are configured to intersect each other. The write/erase word lines 1 and the bit lines 2 respectively extend in directions parallel to the semiconductor substrate 51 (not shown). Formed between the write/erase word line 1 and the bit line 2 along one side surface of the write/erase word line 1 is a resistance varying material 4 mainly composed of $TiO_2$. The write/erase word line 1, the bit line 2, and the resistance varying material 4 are electrically connected to each other. The write/erase word line 1 is configured from such as silicon (Si) including a high concentration impurity showing a metallic conductivity, and the bit line 2 is configured from such as an n-type semiconductor silicon (Si) of low impurity concentration. Further, provided on a surface (second surface) on an opposite side to a surface (first surface) where the bit lines 2 face the write/erase word lines 1 interposing the resistance varying material 4 are a plurality of read word lines 3. The plurality of read word lines 3 extend in the X direction and are arranged having a certain pitch in the Y direction. The write/erase word line 1 and the read word line 3 are disposed such that their respective positions in the Y direction are substantially the same. That is, the write/erase word line 1 and the read word line 3 are provided so as to substantially overlap sandwiching the bit lines 2. The read word line 3 also is configured from such as silicon (Si) including a high concentration impurity showing a metallic conductivity. Formed between the read word line 3 and the bit line 2 along a side surface of the read word line 3 is an insulating film 5 configured from such as silicon oxide ($SiO_2$). The read word line 3, the bit line 2, and the insulating film 5 form a MOSFET having the read word line 3 as a gate electrode and the bit line 2 as a channel.

The write/erase word line 1 and read word line 3, and the resistance varying material 4 provided at each intersection of the write/erase word line 1 and read word line 3 with the bit line 2 form a single memory cell MC. In addition, as shown in FIG. 3B, the memory cell array 41 is isolated from lower layer lines including the substrate 51 and upper layer lines (not shown) by the interlayer insulating films 6 and 7 configured from such as silicon oxide ($SiO_2$). In such a structure, the bit line 2 and the resistance varying material 4 are not applied with an electric field other than a desired electric field.

Now, the resistance varying material 4 is a material configured to change between at least two resistance states of a low-resistance state and a high-resistance state. The resistance varying material 4 is known to change from the high-resistance state to the low-resistance state upon application of a voltage of a certain value or more, and to change from the low-resistance state to the high-resistance state upon flow of a current of a certain value or more. This property is utilized to enable configuration of a memory element. A thin film configured from one of materials such as $ZnMn_2O_4$, NiO, $SrZrO_3$, $Pr_{0.7}Ca_{0.3}MnO_3$, HfO, or a material composed mainly of carbon may be employed as the resistance varying material 4, as well as a thin film configured from $TiO_2$.

As shown in FIG. 3A, the semiconductor memory device of the present embodiment has a so-called cross-point type configuration in which the memory cells MC are formed at each of the intersections of the write/erase word lines 1 and read word lines 3 with the bit lines 2. In this configuration, the write/erase word lines 1 and read word lines 3 and the bit lines 2 simply adopt a line-and-space pattern, and the only requirement for a positional relationship between the write/erase word lines 1 and read word lines 3 and the bit lines 2 is that they intersect each other in an orthogonal manner. There is no need to consider misalignment in the word line direction and the bit line direction. It is thus possible for alignment accuracy in the memory cell array in a manufacturing process to be relaxed to a high degree, whereby manufacturing can be easily performed. Further, this structure is a high integration structure in which one bit of information can be stored in a $4F^2$ region.

Operation of Semiconductor Memory Device in Accordance with First Embodiment

Figure 4A:
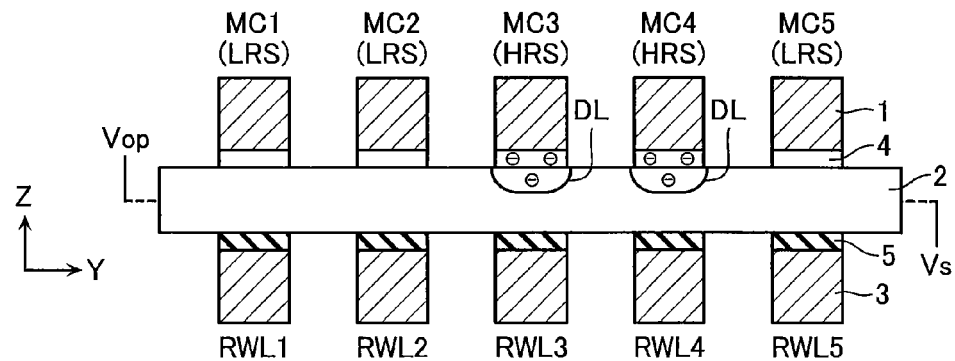
FIG. 4A is a schematic view for explaining operation of the semiconductor memory device in accordance with the first embodiment.
Figure 4B:
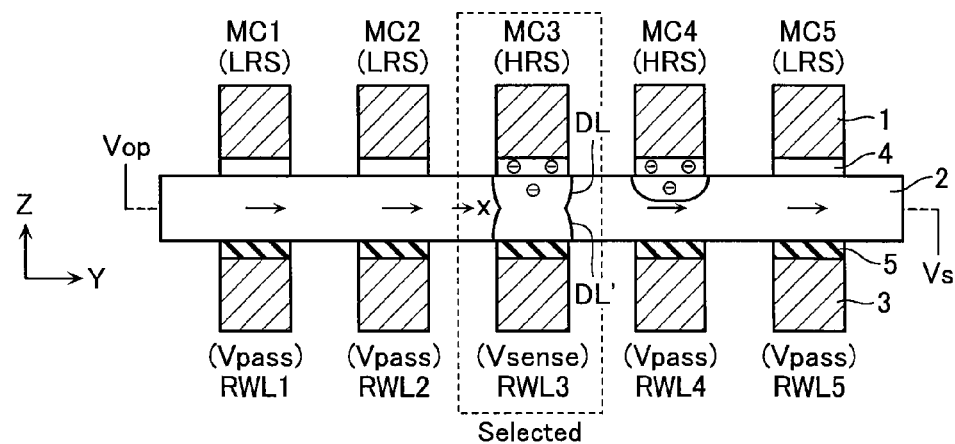
FIG. 4B is a schematic view for explaining operation of the semiconductor memory device in accordance with the first embodiment.
Figure 4C:
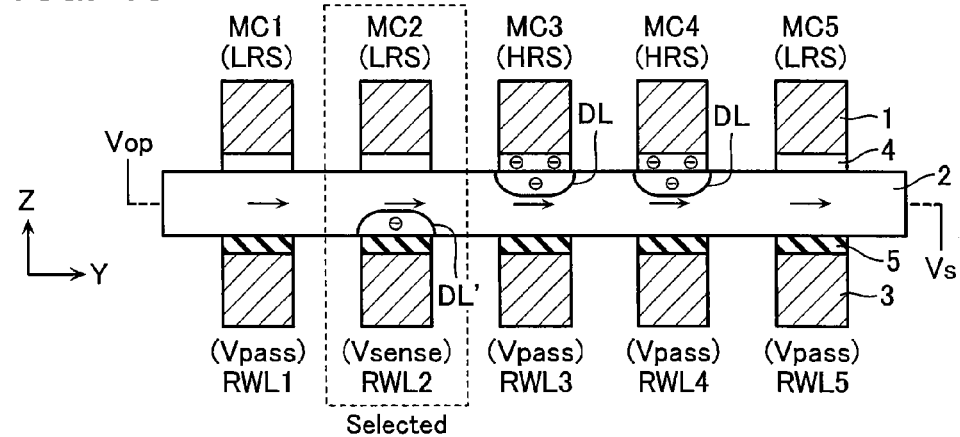
FIG. 4C is a schematic view for explaining operation of the semiconductor memory device in accordance with the first embodiment.
Figure 5A:
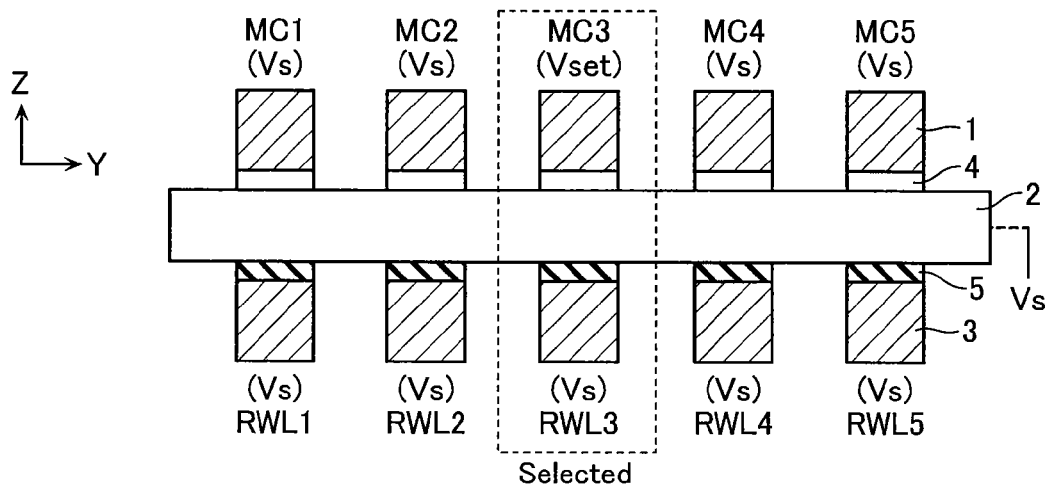
FIG. 5A is a schematic view for explaining operation of the semiconductor memory device in accordance with the first embodiment.
Figure 5B:
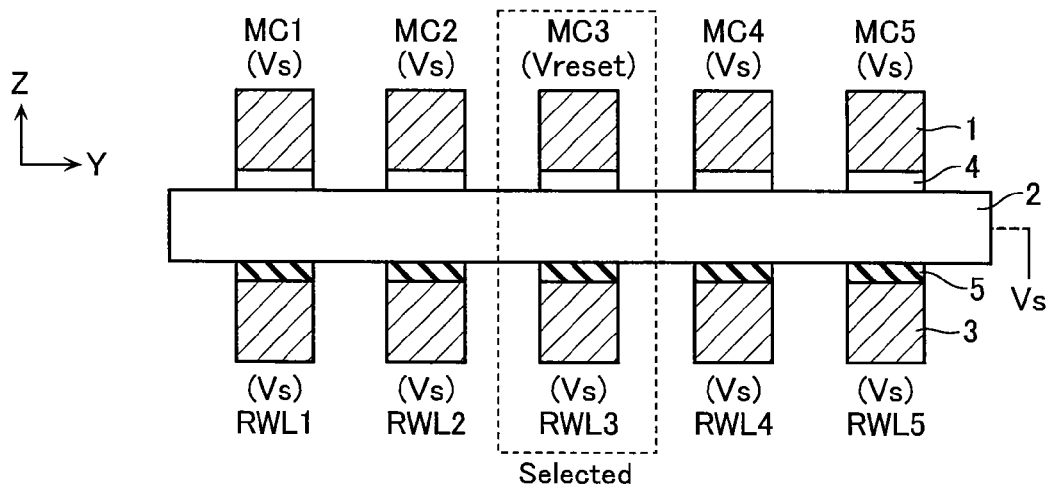
FIG. 5B is a schematic view for explaining operation of the semiconductor memory device in accordance with the first embodiment.

Next, operation of the semiconductor memory device in accordance with the present embodiment formed as above is described with reference to FIGS. 4A-5B. FIGS. 4A-4C are schematic views for explaining a read operation in the semiconductor memory device in accordance with the present embodiment. FIGS. 5A-5B are schematic views for explaining write/erase operations in the semiconductor memory device in accordance with the present embodiment. FIGS. 4A-5B are also schematic views of a cross-section corresponding to the I-I' line cross-section of FIG. 3A.

First, the read operation in the semiconductor memory device in accordance with the present embodiment is described with reference to FIGS. 4A-4C. Resistance change occurring due to presence/absence of charge trapped in a charge trap existing in a film of the resistance varying material 4 or at an electrode interface may be considered as a model for change of a resistance state of the resistance varying material 4. Of course, various models exist according to a material, hence other models are also conceivable.

Now, it is assumed that, when the resistance varying material 4 of a memory cell MC is in a high-resistance state (HRS), much negative charge is stored in the resistance varying material 4, and when in a low-resistance state (LRS), less negative charge than during the high-resistance state (HRS) is stored in the resistance varying material 4. Moreover, as shown in FIG. 4A, in a memory cell MC in the high-resistance state (HRS) (memory cells MC3 and MC4 in FIG. 4A), the negative charge stored in the resistance varying material 4 causes a large depletion layer DL to be formed in the bit line 2 configured from n-type semiconductor silicon. On the other hand, in a memory cell MC in the low-resistance state (LRS)

(memory cells MC1, MC2, and MC5 in FIG. 4A), the amount of negative charge stored in the resistance varying material 4 is less than in the case of the high-resistance state (HRS), hence almost no depletion layer is formed in the bit line 2 configured from n-type semiconductor silicon. The read operation in the semiconductor memory device in the present embodiment is described below.

During the read operation, the read word line 3 corresponding to a selected one of the memory cells MC connected in series along a longer direction of the bit line 2, that is, one subject to data read, is applied with a voltage Vsense (negative voltage). On the other hand, the read word line 3 corresponding to an unselected memory cell MC not subject to data read is applied with a voltage Vpass (positive high voltage). The voltage Vsense applied to the selected read word line 3 need to be set to a voltage at which a depletion layer DL' is formed in the selected bit line 2 configured from the n-type semiconductor silicon. In addition, the voltage Vpass applied to the unselected read word line 3 need only be set to a voltage at which a depletion layer is not generated in the bit line 2 and the bit line 2 maintains a conductive state irrespective of a state of charge storage in the resistance varying material 4. Moreover, the bit line 2 has its one end applied with an operating voltage Vop and its other end applied with a ground voltage Vs, so that a certain current flows in the bit line 2 during the read operation.

FIG. 4B shows the case of selecting and reading data from the memory cell MC3 which is in the high-resistance state (HRS). The read word line 3 (RWL3) corresponding to the selected memory cell MC3 subject to data read is applied with the voltage Vsense. Meanwhile, the read word lines 3 (RWL1, RWL2, RWL4, and RWL5) corresponding to the unselected memory cells MC1, MC2, MC4, and MC5 not subject to data read are applied with the voltage Vpass (positive high voltage). In addition, the bit line 2 has its one end applied with the operating voltage Vop and its other end applied with the ground voltage Vs.

As shown in FIG. 4B, in the selected memory cell MC3 having its corresponding read word line 3 (RWL3) applied with the voltage Vsense, a depletion layer DL' extends in the bit line 2 also from a read word line 3 side. Since the selected memory cell MC3 is in the high-resistance state (HRS), the depletion layer DL extends from the resistance varying material 4, and the depletion layer DL' extends in the bit line 2 (MOSFET channel region) also from the read word line 3. As a result, the bit line 2 attains the high-resistance state. In this case, it becomes difficult for current to flow in the bit line 2.

Note that in a memory cell having its read word line 3 applied with the voltage Vpass (for example, MC4), the depletion layer DL extending from the resistance varying material 4 retreats (contracts) due to the effect of the voltage Vpass, even if the resistance varying material 4 is in the high-resistance state (HRS). In the unselected memory cell MC4, the bit line 2 attains the conductive state, even if the resistance varying material 4 is in the high-resistance state. Moreover, in unselected memory cells where the resistance varying material 4 is in the low-resistance state (LRS) (for example, MC1, MC2, and MC5), the bit line 2 attains the conductive state without a depletion layer extending in the bit line 2.

FIG. 4C shows the case of selecting and reading data from the memory cell MC2 which is in the low-resistance state (LRS). The read word line 3 (RWL2) corresponding to the selected memory cell MC2 subject to data read is applied with the voltage Vsense. Meanwhile, the read word lines 3 (RWL1, RWL3, RWL4, and RWL5) corresponding to the unselected memory cells MC1, MC3, MC4, and MC5 not subject to data read are applied with the voltage Vpass (positive high voltage). In addition, the bit line 2 has its one end applied with the operating voltage Vop and its other end applied with the ground voltage Vs.

As shown in FIG. 4C, in the selected memory cell MC2 having its corresponding read word line 3 (RWL2) applied with the voltage Vsense, a depletion layer DL' extends in the bit line 2 from the read word line 3 side. However, the selected memory cell MC2 is in the low-resistance state (LRS), and the depletion layer DL extending from the resistance varying material 4 is retreated. The depletion layer DL' extending from the read word line 3 does not extend into the entirety of the bit line 2 (MOSFET channel region) and, as a result, the bit line 2 maintains the conductive state. In this case, it becomes easier for current to flow in the bit line 2 than in the case shown in FIG. 4B.

Note that in a memory cell having its read word line 3 applied with the voltage Vpass (for example, MC3 and MC4), the depletion layer DL' retreats (contracts) due to the effect of the voltage Vpass, even if the resistance varying material 4 is in the high-resistance state (HRS). In the unselected memory cells MC3 and MC4, the bit line 2 attains the conductive state, even if the resistance varying material 4 is in the high-resistance state. Moreover, in unselected memory cells where the resistance varying material 4 is in the low-resistance state (LRS) (for example, MC1 and MC5), the bit line 2 attains the conductive state without depletion layers DL and DL' extending in the bit line 2.

In this way, whether it is easy or difficult for current to flow in bit line 2 during the read operation depends only on the resistance state (HRS, LRS) of the selected memory cell. Detecting current flowing in the bit line 2 during the read operation thus allows the resistance state of the selected memory cell MC to be detected. This read operation is never affected by the resistance state of other memory cells MC.

Now, the above-mentioned read operation is described assuming the voltage Vsense to be a negative voltage and the voltage Vpass to be a positive high voltage. However, the voltage Vsense and the voltage Vpass may both be set to a positive voltage by adding to each a voltage Va. This allows control voltages to be generated easily by the power source 45. The voltage Vsense applied to the selected read word line need only be set to a voltage at which the conductive/non-conductive state of the selected bit line 2 changes depending on the resistance state of the resistance varying material 4. In addition, the voltage Vpass applied to the unselected read word line need only be set to a voltage at which the selected bit line 2 maintains the conductive state irrespective of the resistance state of the resistance varying material 4. Note that, in the case that the resistance varying material 4 stores a positive charge, the read operation can be similarly performed, if p-type semiconductor silicon is used in the bit line 2 and if positive/negative of the voltages is reversed with respect to the aforementioned description.

Next, write/erase operations in the semiconductor memory device in accordance with the present embodiment are described with reference to FIGS. 5A and 5B. Write of data to a selected memory cell MC is performed by applying a certain voltage to the resistance varying material 4 for a short time. This causes the resistance varying material 4 to change from the high-resistance state to the low-resistance state. This operation to change the resistance varying material 4 from the high-resistance state to the low-resistance state is hereinafter referred to as a setting operation. On the other hand, erase of data in a selected memory cell MC is performed by applying a certain voltage to the resistance varying material 4 for a long time, the certain voltage being lower than that applied during the setting operation, and the resistance varying material 4 being in the low-resistance state subsequent to the setting operation. This causes the resistance varying material 4 to change from the low-resistance state to the high-resistance state. This operation to change the resistance varying material 4 from the low-resistance state to the high-resistance state is hereinafter referred to as a resetting operation. The memory cell MC adopts, for example, the high-resistance state as a stable state (reset state), and, in the case of binary data storage, write of data is performed by the setting operation in which the reset state is changed to the low-resistance state.

In the semiconductor memory device of the present embodiment, a minute negative charge is stored in the resistance varying material 4 not only, of course, when the resistance varying material 4 of each memory cell MC is in the high-resistance state but also even when the resistance varying material 4 of each memory cell MC is in the low-resistance state. Therefore, a minute depletion layer DL is formed in the bit line 2 even in low-resistance state memory cells MC. The depletion layer DL formed due to the low-resistance state memory cells MC is of a magnitude not affecting the aforementioned read operation. The semiconductor memory device has a structure in which a schottky diode utilizing a schottky barrier based on this depletion layer DL is series-connected to the resistance varying material 4 in all of the memory cells MC. Therefore, write/erase operations to the memory cells MC in the semiconductor memory device of the present embodiment can be performed similarly to operations in an ordinary cross-point type array. That is, in the write/erase operations, the write/erase word line 1 connected to a selected memory cell MC is applied with the operating voltage Vop, and a selected bit line 2 is applied with the ground voltage Vs. In addition, an unselected write/erase word line 1 is applied with the ground voltage Vs and an unselected bit line 2 is applied with the operating voltage Vop. The operating voltage Vop is set to a setting voltage Vset during the setting operation, and is set to a resetting voltage Vreset during the resetting operation.

A memory cell MC connected to the intersection of a selected write/erase word line 1 and a selected bit line 2 is hereinafter referred to as being in a selected state (forward bias state). The memory cell MC in the selected state is applied with the voltage Vop in a forward bias direction of the schottky diode from the selected write/erase word line 1 (voltage Vop) to the selected bit line 2 (voltage Vs). This causes a potential difference Vop to be applied to the selected memory cell MC, whereby the resistance state of the resistance varying material 4 in the selected memory cell MC changes.

A memory cell MC connected to the intersection of a selected write/erase word line 1 and an unselected bit line 2 is hereinafter referred to as being in a half-selected state (unbiased state). In addition, a memory cell MC connected to the intersection of an unselected write/erase word line 1 and a selected bit line 2 is hereinafter referred to as being in a half-selected state (unbiased state). The unselected bit line 2 is applied with the same voltage (voltage Vop) as the selected write/erase word line 1. Similarly, the unselected write/erase word line 1 is applied with the same voltage (voltage Vs) as the selected bit line 2. As a result, the memory cell MC in the half-selected state (unbiased state) is not applied with a potential difference, hence the resistance state of its resistance varying material 4 does not change.

A memory cell MC connected to the intersection of an unselected write/erase word line 1 and an unselected bit line 2 is hereinafter referred to as being in an unselected state (reverse bias state). The memory cell MC in the unselected state (reverse bias state) is applied with a voltage in a reverse bias direction of the schottky diode from the unselected bit line 2 (voltage Vop) to the unselected write/erase word line (voltage Vs). The voltage Vop undergoes a voltage drop due to the schottky diode, whereby almost no voltage is applied to the resistance varying material 4. As a result, the memory cell MC in the unselected state (reverse bias state) also undergoes no change in the resistance state of its resistance varying material 4.

FIG. 5A shows a voltage application state during the setting operation. As shown in FIG. 5A, the write/erase word line 1 and the bit line 2 connected to the selected memory cell MC3 are applied with, respectively, the setting voltage Vset and the ground voltage Vs. In addition, unselected write/erase word lines 1 and unselected bit lines 2 (not shown) are applied with, respectively, the ground voltage Vs and the setting voltage Vset. At this time, the read word lines 3 are all applied with the ground voltage Vs since they are not used in the write operation. This causes a potential difference Vset to be applied to the selected memory cell MC, whereby the resistance varying material 4 in the selected memory cell MC changes from the high-resistance state to the low-resistance state, thereby completing the setting operation.

Further, FIG. 5B shows a voltage application state during the resetting operation. As shown in FIG. 5B, the write/erase word line l and the bit line 2 connected to the selected memory cell MC3 are applied with, respectively, the resetting voltage Vreset and the ground voltage Vs. In addition, unselected write/erase word lines 1 and unselected bit lines 2 (not shown) are applied with, respectively, the ground voltage Vs and the resetting voltage Vreset. The read word lines 3 are all applied with the ground voltage Vs similarly to during the setting operation. This causes a potential difference Vreset to be applied to the selected memory cell MC, whereby the resistance varying material 4 in the selected memory cell MC changes from the low-resistance state to the high-resistance state, thereby completing the resetting operation.

In the above-mentioned operations, unselected memory cells MC connected to unselected bit lines 2 not shown and to unselected write/erase word lines 1 are applied with the voltage Vset during the setting operation or the voltage Vreset during the resetting operation in a direction from the bit lines 2 to the write/erase word lines 1. However, the schottky barrier formed by the depletion layer in the resistance varying material 4 causes a large portion of these voltages to undergo a voltage drop, hence, substantively, no voltage is applied to the resistance varying material 4.

Alternatively, if an innovation such as that described below is applied to connecting portions of the write/erase word line 1 and the bit line 2 with the underlying CMOS circuit, then write/erase operations on a specific selected memory cell MC become possible, without relying on the schottky barrier. A method for applying write/erase voltages to the selected memory cell MC using the write/erase word line 1 and the bit line 2 is described below with reference to FIGS. 6 to 9.

Figure 6:
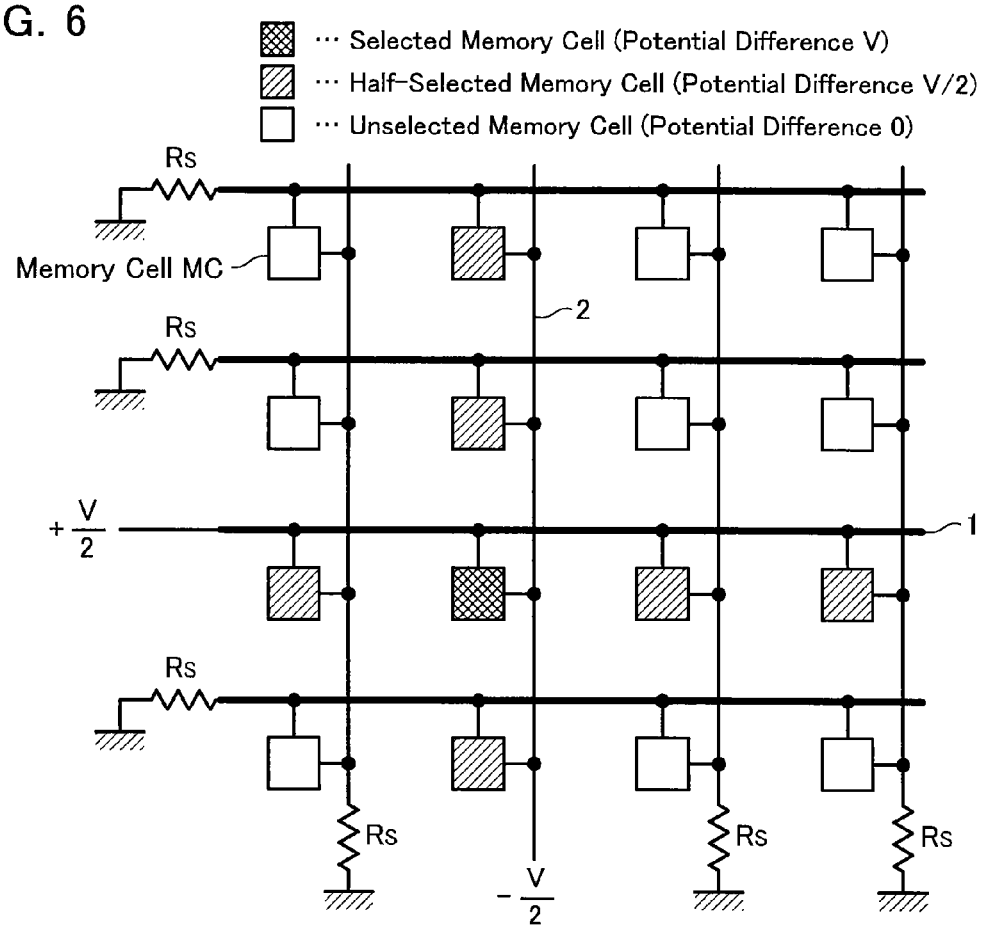
FIG. 6 is a schematic view for explaining operation of the semiconductor memory device in accordance with the first embodiment.
Figure 7:
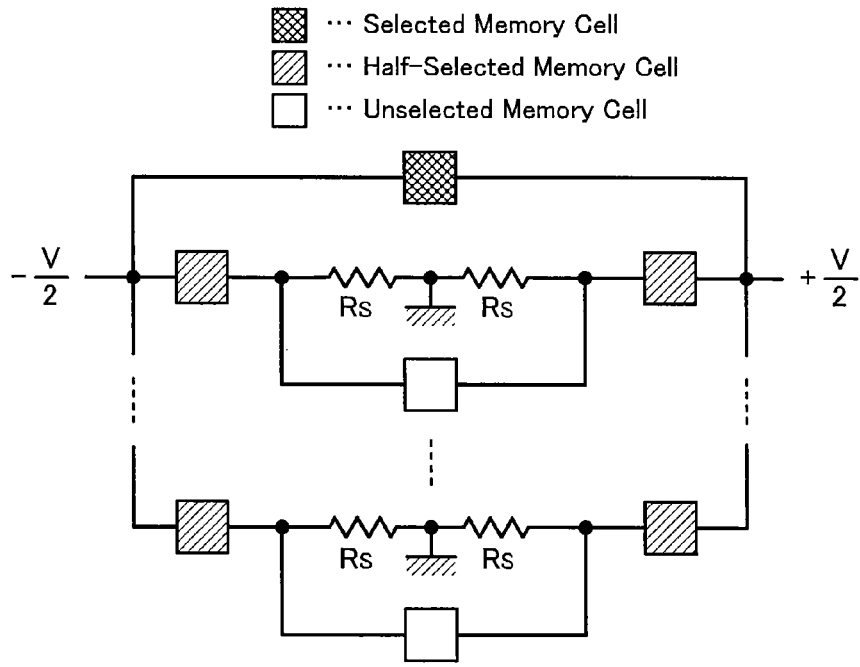
FIG. 7 is a schematic view for explaining operation of the semiconductor memory device in accordance with the first embodiment.
Figure 8:
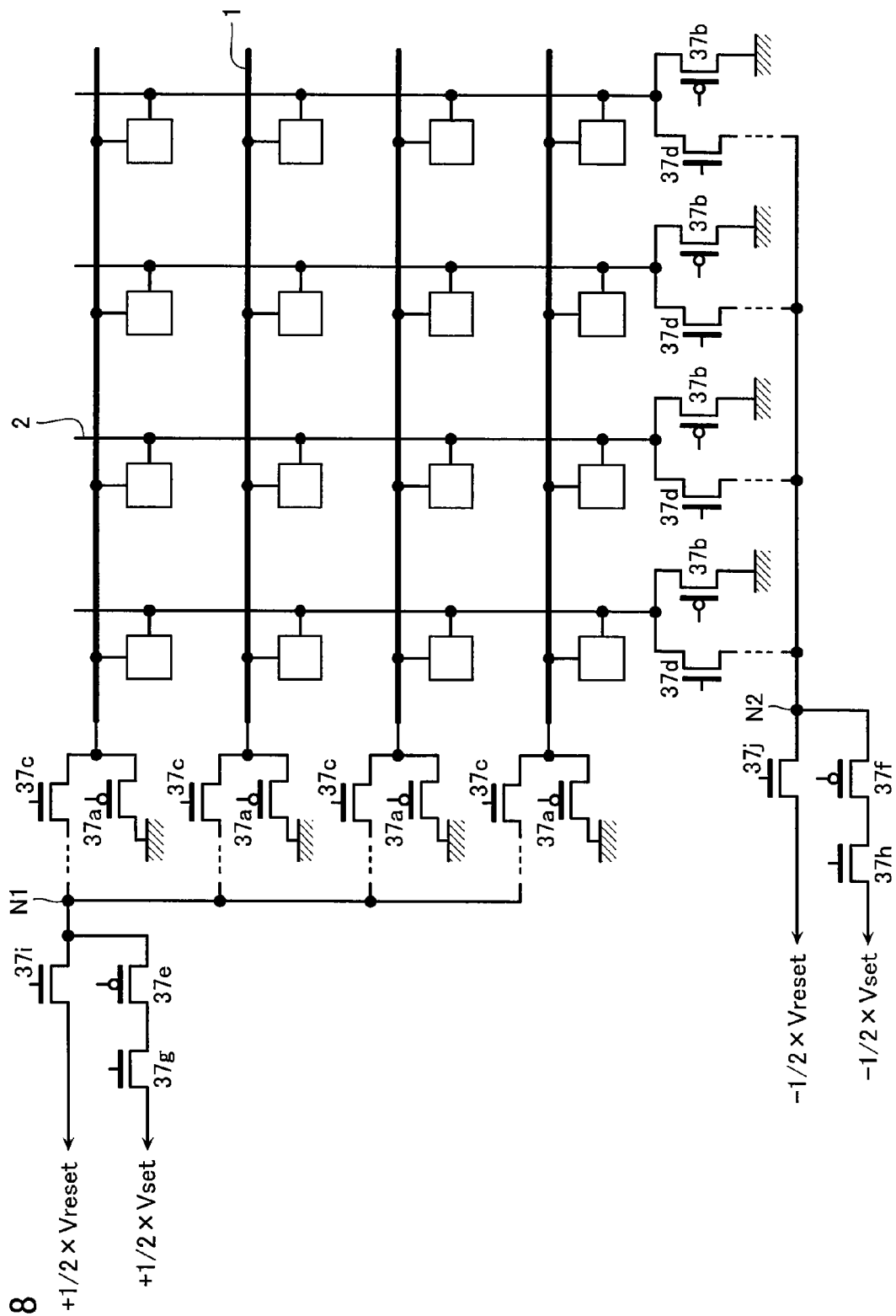
FIG. 8 is a circuit diagram showing a part of the semiconductor memory device in accordance with the first embodiment.
Figure 9:
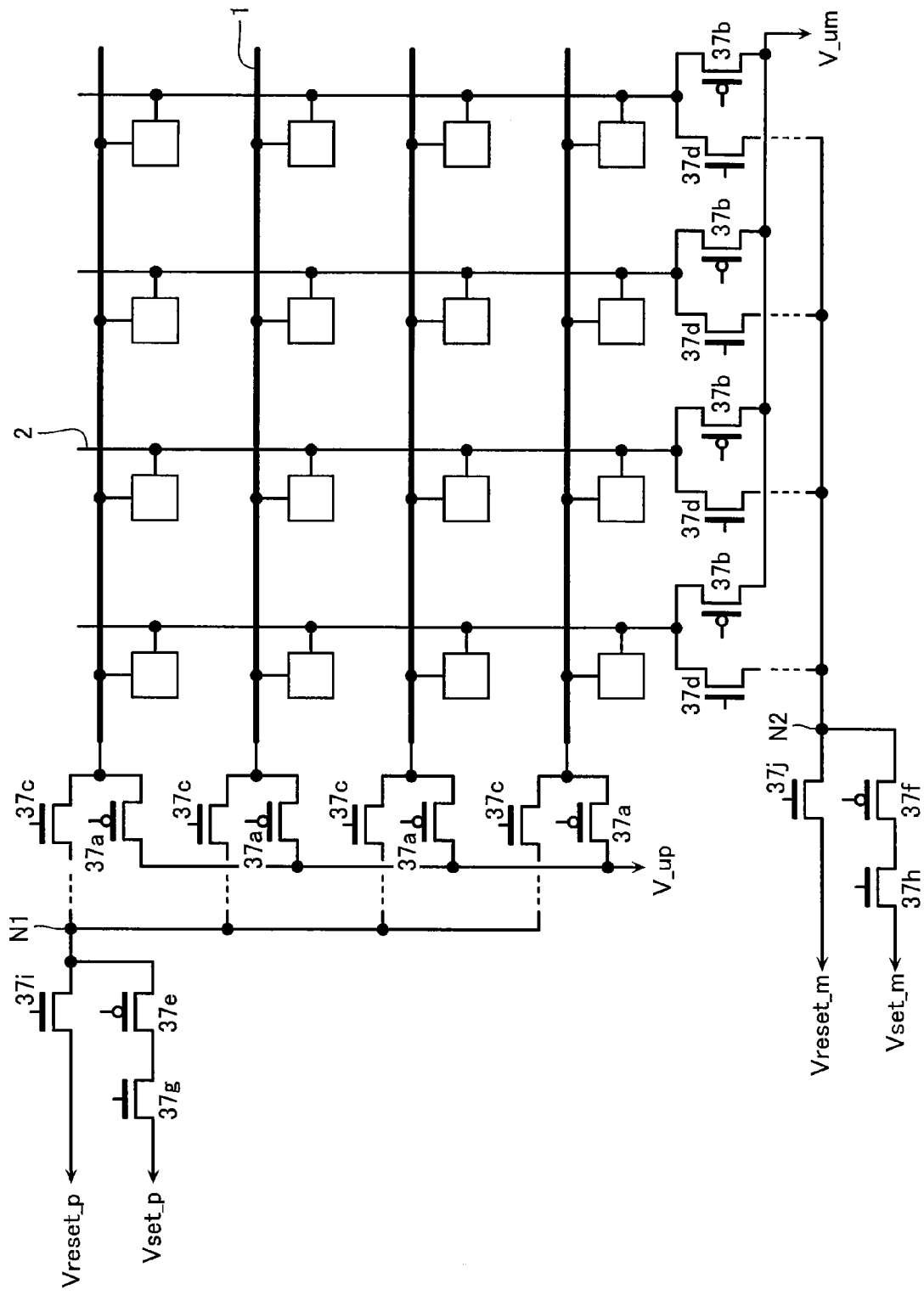
FIG. 9 is a circuit diagram showing a part of the semiconductor memory device in accordance with the first embodiment.

FIGS. 6 and 7 are schematic views for explaining operation of the semiconductor memory device in accordance with the present embodiment. FIGS. 8 and 9 are circuit diagrams showing a part of the semiconductor memory device in accordance with the present embodiment. Note that to simplify description, the read word lines 3 not required in the write/erase operations are omitted from FIGS. 6-9.

In FIGS. 6 and 7, to simplify description, a difference between the operating voltage Vop applied to the write/erase word line 1 and the voltage Vs applied to the bit line 2 is expressed as potential difference V. Further, FIGS. 6 and 7 are described assuming a value of the voltage applied to the write/erase word line 1 to be V/2 and a value of the voltage applied to the bit line 2 to be −V/2. The voltages applied to each of the portions in FIGS. 6 and 7 are assumed to have values that are smaller overall than the voltages applied to each of the portions in FIGS. 5A and 5B by an amount (Vop−Vs)/2. However, if a difference in voltage applied between each of the lines is the same, the voltage applied to the memory cell MC is the same. Consequently, operation of the semiconductor memory device is described below in accordance with FIGS. 6 and 7.

Note that, as mentioned above, the operating voltage Vop is set to the setting voltage Vset during the setting operation and to the resetting voltage Vreset during the resetting operation. Moreover, the description below assumes that the voltage Vs=0. Therefore, during the write operation, the potential difference V is a potential difference corresponding to the setting voltage Vset. Moreover, during the erase operation, the potential difference V is a potential difference corresponding to the resetting voltage Vreset.

FIG. 6 shows a state in which a selected write/erase word line 1 is applied with +V/2, a selected bit line 2 is applied with −V/2, and unselected write/erase word lines 1 and unselected bit lines 2 are connected via a resistance load to a ground potential (Vs=0 V). FIG. 7 is an equivalent circuit diagram rewriting this state such that portions of low potential are rearranged to be on the left side and portions of high potential are rearranged to be on the right side. Although already mentioned, a basic operating principle of write and erase in the memory cell portion is here reconfirmed. The resistance varying material 4 of the memory cell MC used in the present embodiment has characteristics of transiting from a high-resistance state (resistance value: RH) to a low-resistance state (resistance value: RL) when applied with a voltage greater than or equal to a certain threshold voltage (V0set), and of changing from the low-resistance state (resistance value: RL) to the high-resistance state (resistance value: RH) upon flow of a current greater than or equal to a certain current (Ireset). Operations for transiting from the high-resistance state to the low-resistance state, and for transiting from the low-resistance state to the high-resistance state are here defined as a write operation (setting operation) and an erase operation (resetting operation), respectively.

When executing the write operation, the write/erase word line 1 and the bit line 2 connected to the memory cell MC subject to write (selected memory cell) are applied with, respectively, V/2 (=+½×Vset) and −V/2 (=−½×Vset). Other write/erase word lines 1 and bit lines 2 are connected, respectively, via a certain resistance RS which serves as a current limiting element, to a ground line (0 V). Now, the potential difference V (voltage Vset) is set to be greater than a value of the threshold voltage V0set supplemented by a voltage drop due to resistance of the write/erase word line 1, bit line 2, and so on, and less than twice the threshold voltage V0set. If the resistance of the write/erase word line 1 and the bit line 2 is expressed as a resistance Rprs, then the resistance RS is set such that (½)×V/(RL+RS+Rprs) is less than Ireset, and such that RS/(RS+RL+Rprs)×V is less than Ireset×RL. The resistance RS acting as the current limiting element is not limited to being a fixed resistance using the diffusion layer of the silicon (Si) substrate, and a variable resistance using the fact that the drain current of the MOSFET is limited may also be employed as the resistance RS. Note that to prevent re-erase, the power source supplying the ±½×V is provided with an output resistance Rex acting as a current limiting circuit to prevent the output current exceeding Ireset, and is preferably set such that V/(RL+Rex+Rprs) is less than Ireset. The resistance Rex is not limited to a fixed resistance using the diffusion layer of the silicon (Si) substrate, and a variable resistance using the fact that the drain current of the MOSFET is limited may also be employed as the resistance Rex, similarly to the resistance RS.

The above-described setting causes a voltage greater than or equal to the threshold voltage V0set to be applied to the resistance varying material 4 at the intersection of the selected write/erase word line 1 and bit line 2. Write to the memory cell MC including this resistance varying material 4 is thus enabled. In addition, the resistance varying material 4 at intersections where only one of the write/erase word line 1 or the bit line 2 is selected (hereinafter referred to as "half-selected") is only applied with a voltage less than the threshold voltage V0set, thereby preventing execution of an erroneous write, and, moreover, only has a current less than Ireset flowing therein, thereby also preventing execution of an erroneous erase. Furthermore, the resistance varying material 4 at intersections where both the write/erase word line 1 and the bit line 2 are unselected is applied with a voltage of at most RS/(RS+RL+Rprs)×V, if a plurality of low-resistance state memory cells MC exist within the same memory cell array 41. However, from the above-described conditions, execution of an erroneous write and an erroneous erase are prevented, since this voltage does not reach a voltage required for erase (Ireset×RL) or the threshold voltage V0set which is greater than the voltage required for erase.

When performing erase, as shown in FIGS. 6 and 7 and similarly to the case of write, the selected write/erase word line 1 connected to the memory cell MC subject to erase is applied with V/2 (=+½×Vreset), the selected bit line 2 connected to the memory cell MC subject to erase is applied with −V/2 (=−½×Vreset), and the other write/erase word lines 1 and bit lines are connected, respectively, via the certain resistance RS which serves as a current limiting element, to a ground line (0 V). Now, the potential difference V (voltage Vreset) is set to be greater than a value of Ireset×RL supplemented by a voltage drop due to resistance of the write/erase word line 1, bit line 2, and so on, and less than twice Ireset× RL. The resistance RS is set such that ½×V/(RL+RS+Rprs) is less than Ireset, and such that RS/(RS+FRL+Rprs)×V is less than Ireset×RL. The resistance RS acting as the current limiting element is not limited to being a fixed resistance using the diffusion layer of the silicon (Si) substrate, and a variable resistance using the fact that the drain current of the MOSFET is limited may also be employed as the resistance RS. Note that to prevent re-write, RH/(RH+Rprs)×V is naturally set to have a value less than the threshold voltage V0set.

The above-described setting causes a current greater than or equal to Ire set to flow in the resistance varying material 4 at the selected intersection. Erase of the memory cell MC including this resistance varying material 4 is thus enabled. In addition, the resistance varying material 4 at half-selected intersections only has a current less than Ireset flowing therein, thereby preventing execution of an erroneous erase, and, moreover, is not applied with a voltage greater than the threshold voltage V0set either, thereby also preventing execution of an erroneous write. Furthermore, the resistance varying material 4 at intersections where both the write/erase word line 1 and the bit line 2 are unselected is applied with a voltage of at most RS/(RS+RL+Rprs)×V, if a plurality of low-resistance state memory cells MC exist within the same memory cell array 41. However, from the above-described conditions, execution of an erroneous write and an erroneous erase are prevented, since this voltage does not reach a voltage required for erase (Ireset×RL) or the threshold voltage V0set which is greater than the voltage required for erase.

Note that the applied voltage values of FIGS. 6 and 7 represent only one example, and that, since only the relative value of voltages between each of the electrodes is significant, a combination of (V, +0 V/2, 0) may be used instead of the combination (+V/2, 0, −V/2) by adding +V/2 overall, for example. There is an advantage in this case that a circuit for generating a negative voltage is not required.

FIG. 8 shows an example where the fixed resistances RS respectively connected to the write/erase word lines 1 and bit lines 2 in FIG. 6 are substituted by pMOSFETs 37a and 37b to configure an array bias circuit. Each of the write/erase word lines 1 is connected to a ground line (0 V) via the pMOSFET 37a, the pMOSFET 37a configured to be ON when the bit line 2 is unselected. In addition, an nMOSFET 37c configured to be ON when the write/erase word line 1 is selected is also connected in parallel with each of the pMOSFETs 37a. Sources of each of the nMOSFETs 37c are commonly connected to a node N1. An nMOSFET 37i configured to be ON during the erase operation has its drain connected to the node N1. The nMOSFET 37i has its source applied with +½× Vreset. Furthermore, an nMOSFET 37g is connected, via a pMOSFET 37e functioning as an output resistance, to the node Ni. The nMOSFET 37g has its source applied with +½×Vset and is configured to be ON during the write operation.

Meanwhile, each of the bit lines 2 is connected to a ground line (0 V) via the pMOSFET 37b, the pMOSFET 37b configured to be ON when the bit line 2 is unselected. In addition, an nMOSFET 37d configured to be ON when the bit line 2 is selected is also connected in parallel with each of the pMOSFETs 37b. Sources of each of the nMOSFETs 37d are commonly connected to a node N2. An nMOSFET 37j configured to be ON during the erase operation has its drain connected to the node N2. The nMOSFET 37j has its source applied with −½×Vreset. Furthermore, an nMOSFET 37h is connected, via a pMOSFET 37f functioning as an output resistance, to the node N2. The nMOSFET 37h has its source applied with −½×Vset and is configured to be ON during the write operation.

This configuration uses the pMOSFETs 37a and 37b, as current limiting elements, which are controlled depending on the gate voltage and therefore enables a more flexible design to be achieved than the case shown in FIG. 6.

Regarding unselected bias, an offset may be applied with respect to the ground potential enabling overall system power consumption to be reduced. FIG. 9 shows one example of an array bias circuit configured in this case. FIG. 9 has a circuit configuration which is the same as the memory cell portion shown in FIG. 8, but has applied voltages that are changed.

Specifically, the pMOSFETs 37a, 37b, 37g, 37h, 37i, and 37j have their sources applied with, respectively, certain voltages V_up, V_um, Vset_p, Vset_m, Vreset_p, and Vreset_m.

If consideration is given to the write operation, each of the voltages need only be related as follows: Vset_p-Vset_m=Vset, Vset_p>V_up, Vset_p>V_um, V_up>Vset_m, V_um>Vset_m. In contrast, if consideration is given to the erase operation, each of the voltages need only be related as follows: Vreset_p-Vreset_m=Vreset, Vreset_p>V_up, Vreset_p>V_um, V_up>Vreset_m, V_um>Vreset_m. Moreover, provided these conditions are satisfied, the magnitude relation of voltages V_up and V_um may be determined arbitrarily. Note that, when resistance of the bit line 2 is large, there is a risk that voltage drop in the bit line 2 increases. It is thus preferable to apply a positive voltage of appropriate magnitude to the read word line 3, and thereby perform the write/erase operations in a state where conductivity of the channel configuring the selected bit line 2 is enhanced.

Advantages of Semiconductor Memory Device in Accordance with First Embodiment The semiconductor memory device of the present embodiment enables realization of a memory cell array 41 having an extremely simple pattern for the memory cell array 41 and having a structure that does not include difficult-to-form contact holes for each cell. Further, since the line-and-space pattern of the write/erase word lines 1, read word lines 3, and bit lines 2 can be used to form the MOSFETs, high integration can be achieved at a lower production cost than when NOR-type architecture is employed.

In addition, the semiconductor memory device of the present embodiment does not require a current to be passed directly through the resistance varying material 4 during the read operation. It is thereby possible to suppress occurrence of so-called read disturb, where a current flowing in the resistance varying material 4 during the read operation causes the resistance state of the resistance varying material 4 to change unintentionally. As a result, data can be read accurately from the selected memory cell MC.

Note that FIGS. 6-9 are examples of the case where the resistance varying material 4 has its resistance changed by applied voltages of identical polarity, that is, where operation is performed under so-called unipolar conditions. However, in the above-mentioned embodiment, polarity of the selection element is not utilized, hence the resistance varying material 4 may also have its resistance changed by voltages applied in a reverse direction, that is, operation may also be performed under so-called bipolar conditions. In this case, it is simply required to invert polarity of voltages when performing the write operation and the erase operation. It is thus possible for operation to be performed under bipolar conditions without making any large change to the configuration of the control circuits.

Second Embodiment

Next, a semiconductor memory device in a second embodiment of the present invention is described. In the semiconductor memory device of the present embodiment, the semiconductor substrate 51, the CMOS circuit 52, the decoders required for operations, and so on, have configurations similar to those of the semiconductor memory device in the above-described first embodiment shown in FIGS. 1 and 2. Parts corresponding to those in the first embodiment are assigned with identical symbols to those in the first embodiment, and descriptions thereof are thus omitted. The semiconductor memory device of the present embodiment differs from that of the first embodiment in having a memory cell array 41 configured three-dimensionally.

Figure 10:
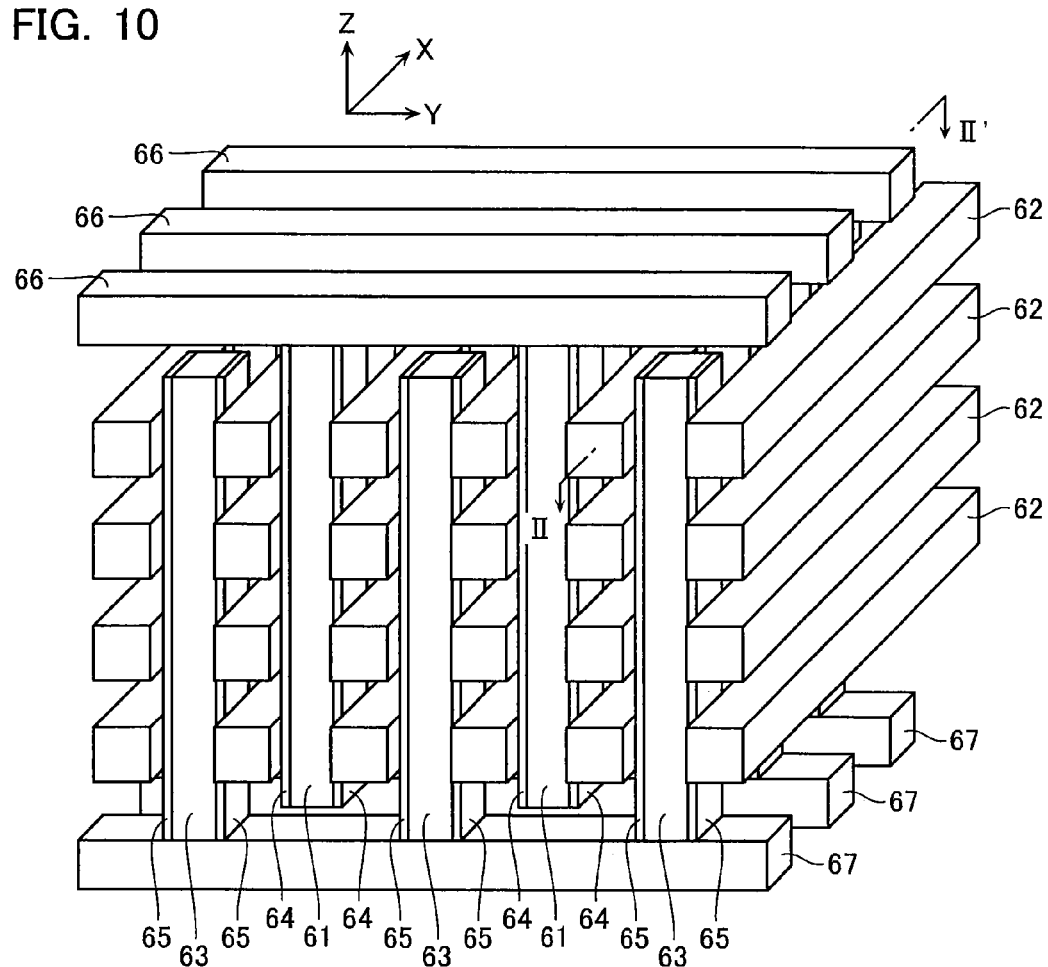
FIG. 10 is a perspective view showing a part of a memory cell array in a semiconductor memory device in accordance with a second embodiment.
Figure 11:
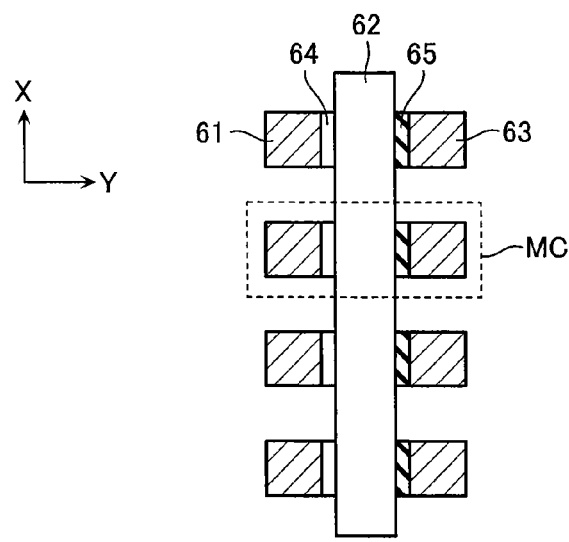
FIG. 11 is a cross-sectional view showing a part of the memory cell array in the semiconductor memory device in accordance with the second embodiment.

Configuration of Semiconductor Memory Device in Accordance with Second Embodiment FIGS. 10 and 11 are, respectively, a perspective view and a cross-sectional view showing a part of the memory cell array 41 in the semiconductor memory device in accordance with the second embodiment of the present invention. FIG. 11 is a cross-sectional view taken along the line II-II' of FIG. 10. Note that in FIG. 10, the memory cell array 41 is isolated from the semiconductor substrate 51 (not shown) in a lower portion in a Z direction of the memory cell array 41 by an interlayer insulating film.

As shown in FIGS. 10 and 11, the memory cell array 41 is provided with a plurality of bit lines 62 extending in an X direction in FIG. 10 and arranged having a certain pitch in a Y direction and the Z direction in FIG. 10, and a plurality of columnar word lines (61 and 63) extending in the Z direction and arranged having a certain pitch in the X direction and the Y direction. The bit lines 62 each extend in a direction parallel to the semiconductor substrate 51 (not shown). There are two kinds of word lines, namely, the write/erase word lines 61 and the read word lines 63. The write/erase word lines 61 and the read word lines 63 are disposed alternately one by one in the Y direction. Formed on two side surfaces of the write/erase word line 61 facing in the Y direction is a thin-film resistance varying material 64 composed mainly of $TiO_2$. The write/erase word line 61, the bit line 62, and the resistance varying material 64 are electrically connected to each other. The bit line 62 intersects the read word line 63 such that, while a surface (first surface) of the bit line 62 opposes the write/erase word line 61 via the resistance varying material 64, another surface (second surface) on an opposite side to the surface (first surface) of the bit line 62 opposes the read word line 63. Disposed on two side surfaces of the read word line 63 facing in the Y direction is an insulating film 65 configured from such as silicon oxide ($SiO_2$). The read word line 63 is connected to the bit line 62 via the insulating film 65.

In the first embodiment, the write/erase word lines 1, the read word lines 3, and the bit lines 2 are each disposed so as to be parallel with the surface of the semiconductor substrate 51. In contrast, in the present embodiment, the bit lines 62 are disposed parallel to the surface of the semiconductor substrate 51 and over a plurality of layers. On the other hand, the write/erase word lines 61 and the read word lines are formed so as to extend in a perpendicular direction with respect to the surface of the semiconductor substrate 51. This allows the memory cell array 41 to be configured three-dimensionally.

Furthermore, connected to ends of an upper portion in the Z direction of the write/erase word lines 61 are a plurality of array word lines 66 extending in the Y direction and arranged having a certain pitch in the X direction. Moreover, connected to ends of a lower portion in the Z direction of the read word lines 63 are a plurality of array word lines 67 extending in the Y direction and arranged having a certain pitch in the X direction. The array word lines 66 and the array word lines 67 are disposed so as to be in a parallel relationship and such that a position in the X direction is the same.

The write/erase word line 61 and the read word line 63 are configured from such as silicon (Si) including a high concentration impurity showing a metallic conductivity, and the bit line 62 is configured from an n-type semiconductor silicon (Si) of low impurity concentration. The read word line 63, bit line 62, and insulating film 65 form a MOSFET having the read word line 63 as a gate electrode and the bit line 62 as a channel. These write/erase word line 61, bit line 62, read word line 63, and resistance varying material 64 form a single memory cell MC. Moreover, the memory cell array 41 is isolated from lower layer wiring including the semiconductor substrate 51 and upper layer wiring by interlayer insulating films (not shown) configured from such as silicon oxide ($SiO_2$). In such a structure, the bit line 62 and the resistance varying material 64 are not applied with an electric field other than a desired electric field.

Diffusion layer wiring formed on a crystalline silicon (Si) substrate may be used as the array word line 67. Moreover, the array word line 66 may use ordinary metal wiring or may be configured from silicon (Si) including a high concentration of an impurity such as phosphorus (P), and showing metallic conductivity. In the case of using the metal wiring, there is an advantage that line resistance can be reduced. As shown in FIG. 10, the semiconductor memory device of the present embodiment is configured having the write/erase word lines 61 and read word lines 63 and the bit lines 62 in an orthogonal positional relationship. In this configuration, the write/erase word lines 61, the read word lines 63, and the bit lines 62 need only have line-and-space patterns, and there is no need to consider misalignment in the X direction and Z direction. It is thus possible for alignment accuracy in the memory cell array 41 in a manufacturing process to be relaxed to a high degree, whereby manufacturing can be easily performed. Further, utilizing this kind of three-dimensional structure enables realization of an ultra-high integration structure in which multiple-bit information can be stored in a $4F^2$ region.

Operation of Semiconductor Memory Device in Accordance with Second Embodiment

Operation of the semiconductor memory device in accordance with the present embodiment formed as above can be executed similarly to operation in the first embodiment shown in FIGS. 4A-5B.

During the read operation, the read word line 63 corresponding to a selected one of the memory cells MC aligned in series in a bit line direction, that is, one subject to data read, is applied with the voltage Vsense (negative voltage) via the array word line 67. The read word line 63 corresponding to an unselected memory cell MC not subject to data read is applied with the voltage Vpass (positive high voltage) via the array word line 67. Moreover, the bit line 62 has its one end applied with the operating voltage Vop and its other end applied with the ground voltage Vs, so that a certain current flows in the bit line 62 during the read operation. Detecting a current flowing in the bit line 62 during the read operation allows the resistance state of the selected memory cell MC to be detected.

In addition, during the write/erase operations, a selected write/erase word line 61 connected to a selected memory cell MC is applied with the operating voltage Vop via the array word line 66. A selected bit line 62 connected to the selected memory cell MC is applied with the ground voltage Vs. In addition, an unselected write/erase word line 61 is applied with the ground voltage Vs via the array word line 66, and an unselected bit line 62 is applied with the operating voltage Vop. The operating voltage Vop is set to a setting voltage Vset during the setting operation, and is set to a resetting voltage Vreset during the resetting operation. This voltage application allows the write/erase operations to be executed.

Advantages of Semiconductor Memory Device in Accordance with Second Embodiment

The semiconductor memory device of the present embodiment also does not require a current to be passed directly through the resistance varying material 64 during the read operation. It is thereby possible to suppress occurrence of so-called read disturb, where a current flowing in the resistance varying material 64 during the read operation causes the resistance state of the resistance varying material 64 to change unintentionally. As a result, data can be read accurately from the selected memory cell MC.

Furthermore, even when the memory cell array 41 is configured three-dimensionally, the write/erase word lines 61, read word lines 63, and bit lines 62 to be applied with voltages can be individually selected, thereby allowing current flowing in unnecessary parts of the memory cell array 41 to be significantly reduced. This enables a reduction in power consumption and increase in operating margin to be achieved.

Third Embodiment

Next, a semiconductor memory device in a third embodiment of the present invention is described. In the semiconductor memory device of the present embodiment, the semiconductor substrate 51, the CMOS circuit 52, the decoders required for operations, and so on, have configurations similar to those of the semiconductor memory device in the above-described first embodiment shown in FIGS. 1 and 2. Parts corresponding to those in the first embodiment are assigned with identical symbols to those in the first embodiment, and descriptions thereof are thus omitted. The semiconductor memory device of the present embodiment also differs from that of the first embodiment in having a memory cell array 41 configured three-dimensionally.

Figure 12:
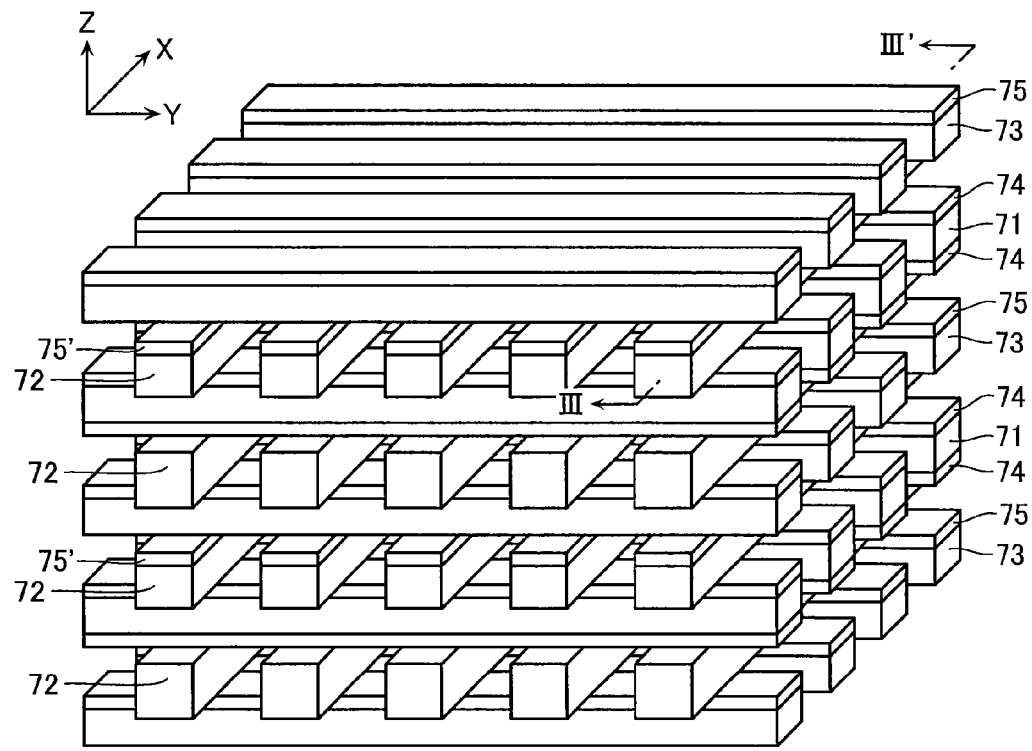
FIG. 12 is a perspective view showing a part of a memory cell array in a semiconductor memory device in accordance with a third embodiment.
Figure 13:
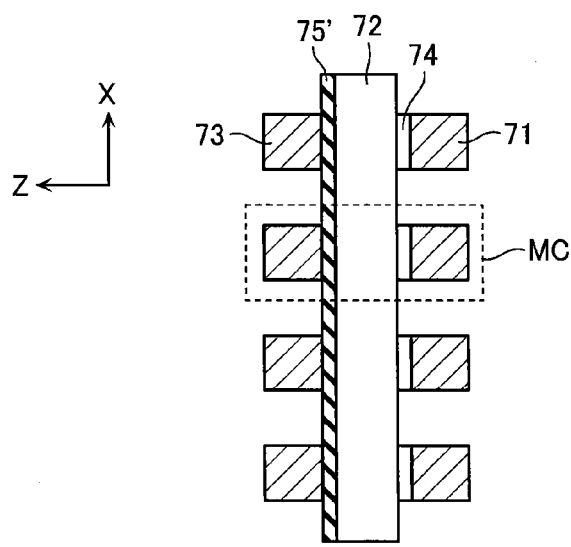
FIG. 13 is a cross-sectional view showing a part of the memory cell array in the semiconductor memory device in accordance with the third embodiment.

Configuration of Semiconductor Memory Device in Accordance with Third Embodiment FIGS. 12 and 13 are, respectively, a perspective view and a cross-sectional view showing a part of the memory cell array 41 in the semiconductor memory device in accordance with the third embodiment of the present invention. FIG. 13 is a cross-sectional view taken along the line III-III' of FIG. 12. Note that in FIG. 12, the memory cell array 41 is isolated from the semiconductor substrate 51 (not shown) in a lower portion in a Z direction of the memory cell array 41 by an interlayer insulating film.

As shown in FIGS. 12 and 13, the memory cell array 41 is provided with a plurality of bit lines 72 extending in an X direction in FIG. 12 and arranged having a certain pitch in a Y direction and the Z direction in FIG. 12, and a plurality of word lines (71 and 73) extending in the Y direction and arranged having a certain pitch in the X direction and the Z direction. There are two kinds of word lines, namely, the write/erase word lines 71 and the read word lines 73. The write/erase word lines 71 and the read word lines 73 are disposed alternately in the Z direction. In addition, the bit line 72 is formed so as to be sandwiched between the write/erase word line 71 and the read word line 73. The bit line 72, the write/erase word line 71, and the read word line 73 each extend in a direction parallel to the semiconductor substrate 51 (not shown). Formed on two side surfaces of the write/erase word line 71 facing in the Z direction is a thin-film resistance varying material 74 composed mainly of $TiO_2$. The write/erase word line 71, the bit line 72, and the resistance varying material 74 are electrically connected to each other. The bit line 72 intersects the read word line 73 such that, while a surface (first surface) of the bit line opposes the write/erase word line 71 via the resistance varying material 74, another surface (second surface) on an opposite side to the surface (first surface) of the bit line 72 opposes the read word line 73. Formed on an upper surface (surface facing in the Z direction) of the read word line 73 is an insulating film 75 configured from such as silicon oxide ($SiO_2$). The read word line 73 is connected to the bit line 72 via the insulating film 75.

In addition, formed along an upper surface of the bit line 72 where the bit line 72 opposes the read word line 73 is an insulating film 75' configured from such as silicon oxide ($SiO_2$). The read word line 73 is in contact with the bit line 72 via this insulating film 75'. In the second embodiment, the write/erase word lines 61 and the read word lines 63 are formed so as to extend in a perpendicular direction with respect to the surface of the semiconductor substrate 51. However, in the present embodiment, the write/erase word lines 71 and read word lines 73, and the bit lines 72 are disposed so as to be stacked in the Z direction perpendicular to the surface of the semiconductor substrate 51, whereby the memory cell array 41 is configured three-dimensionally. This configuration may be regarded as one in which the configuration of the memory cell array 41 shown in the first embodiment is stacked in the Z direction.

The write/erase word line 71 and the read word line 73 are configured from such as silicon (Si) including a high concentration impurity showing a metallic conductivity, and the bit line 72 is configured from an n-type semiconductor silicon (Si) of low impurity concentration. The read word line 73, bit line 72, and insulating films 75 and 75' form a MOSFET having the read word line 73 as a gate electrode and the bit line 72 as a channel. These write/erase word line 71, bit line 72, read word line 73, and resistance varying material 74 form a single memory cell MC. Moreover, the memory cell array 41 is isolated from lower layer wiring including the semiconductor substrate 51 and upper layer wiring by interlayer insulating films (not shown) configured from such as silicon oxide ($SiO_2$). In such a structure, the bit line 72 and the resistance varying material 74 are not applied with an electric field other than a desired electric field.

As shown in FIG. 12, the semiconductor memory device of the present embodiment is configured having the write/erase word lines 71 and read word lines 73 and the bit lines 72 in an orthogonal positional relationship. In this configuration, the write/erase word lines 71, the read word lines 73, and the bit lines 72 need only have line-and-space patterns, and there is no need to consider misalignment in the X direction and Y direction. It is thus possible for alignment accuracy in the memory cell array 41 in a manufacturing process to be relaxed to a high degree, whereby manufacturing can be easily performed. Further, utilizing this kind of three-dimensional structure enables realization of an ultra-high integration structure in which multiple-bit information can be stored in a $4F^2$ region.

Operation of Semiconductor Memory Device in Accordance with Third Embodiment

Operation of the semiconductor memory device in accordance with the present embodiment formed as above can be executed similarly to operation in the first embodiment shown in FIGS. 4A-5B.

During the read operation, the read word line 73 corresponding to a selected one of the memory cells MC aligned in series in the bit line direction, that is, one subject to data read, is applied with the voltage Vsense (negative voltage). The read word line 73 corresponding to an unselected memory cell MC not subject to data read is applied with the voltage Vpass (positive high voltage). Moreover, the bit line 72 has its one end applied with the operating voltage Vop and its other end applied with the ground voltage Vs, so that a certain current flows in the bit line 72 during the read operation. Detecting a current flowing in the bit line 72 during the read operation allows the resistance state of the selected memory cell MC to be detected.

In addition, during the write/erase operations, a selected write/erase word line 71 connected to a selected memory cell MC is applied with the operating voltage Vop. A selected bit line 72 connected to the selected memory cell MC is applied with the ground voltage Vs. In addition, an unselected write/erase word line 71 is applied with the ground voltage Vs and an unselected bit line 72 is applied with the operating voltage Vop. The operating voltage Vop is set to a setting voltage Vset during the setting operation, and is set to a resetting voltage Vreset during the resetting operation. This voltage application allows the write/erase operations to be executed.

Advantages of Semiconductor Memory Device in Accordance with Third Embodiment

The semiconductor memory device of the present embodiment also does not require a current to be passed directly through the resistance varying material 74 during the read operation. It is thereby possible to suppress occurrence of so-called read disturb, where a current flowing in the resistance varying material 74 during the read operation causes the resistance state of the resistance varying material 74 to change unintentionally. As a result, data can be read accurately from the selected memory cell MC.

Furthermore, even when the memory cell array 41 is configured three-dimensionally, the write/erase word lines 71, read word lines 73, and bit lines 72 to be applied with voltages can be individually selected, thereby allowing current flowing in unnecessary parts of the memory cell array 41 to be significantly reduced. This enables a reduction in power consumption and increase in operating margin to be achieved.

Fourth Embodiment

Next, a semiconductor memory device in a fourth embodiment of the present invention is described. In the semiconductor memory device of the present embodiment, the semiconductor substrate 51, the CMOS circuit 52, the decoders required for operations, and so on, have configurations similar to those of the semiconductor memory device in the above-described first embodiment shown in FIGS. 1 and 2. Parts corresponding to those in the first embodiment are assigned with identical symbols to those in the first embodiment, and descriptions thereof are thus omitted. The semiconductor memory device of the present embodiment also differs from that of the first embodiment in having a memory cell array 41 configured three-dimensionally.

Figure 14:
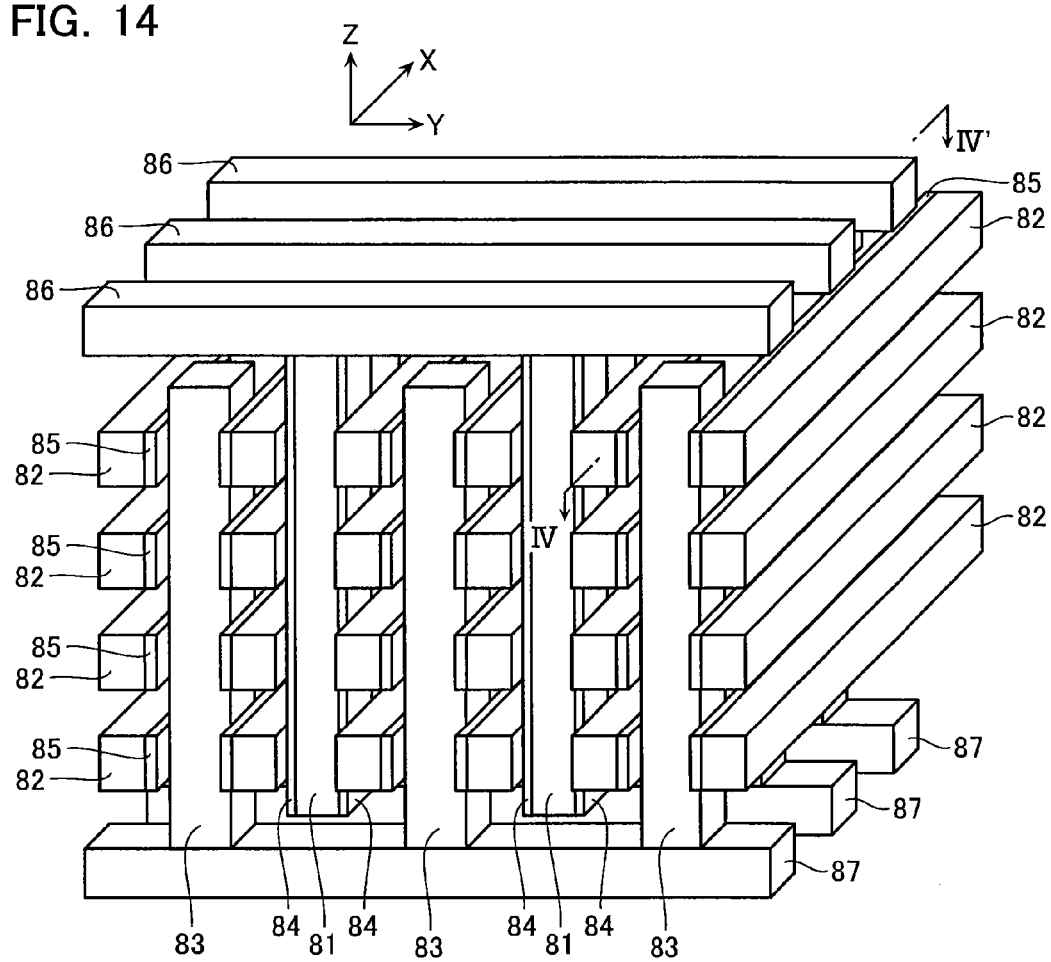
FIG. 14 is a perspective view showing a part of a memory cell array in a semiconductor memory device in accordance with a fourth embodiment.
Figure 15:
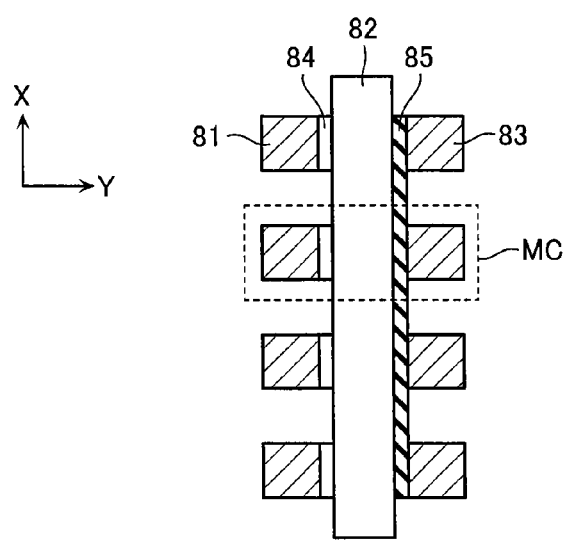
FIG. 15 is a cross-sectional view showing a part of the memory cell array in the semiconductor memory device in accordance with the fourth embodiment.

Configuration of Semiconductor Memory Device in Accordance with Fourth Embodiment FIGS. 14 and 15 are, respectively, a perspective view and a cross-sectional view showing a part of the memory cell array 41 in the semiconductor memory device in accordance with the fourth embodiment of the present invention. FIG. 15 is a cross-sectional view taken along the line IV-IV' of FIG. 14. Note that in FIG. 14, the memory cell array 41 is isolated from the semiconductor substrate 51 (not shown) in a lower portion in a Z direction of the memory cell array 41 by an interlayer insulating film.

The configuration of the memory cell array 41 in the semiconductor memory device in the present embodiment is substantially similar to that of the semiconductor memory device in the second embodiment. A write/erase word line 81, a bit line 82, a read word line 83, a resistance varying material 84, and array word lines 86 and 87 in the present embodiment correspond, respectively, to the write/erase word line 61, the bit line 62, the read word line 63, the resistance varying material 64, and the array word lines 66 and 67 in the second embodiment.

The memory cell array 41 in the present embodiment differs from that in the second embodiment in having an insulating film 85 formed along a side surface of the bit line 82 where the bit line 82 is in contact with the read word line 83. The insulating film 85 or resistance varying material 84 need only be sandwiched between the write/erase word line 81 or read word line 83 and the bit line 82, and selection of which side surface of the write/erase word line 81, read word line 83 or bit line 82 the insulating film 85 or resistance varying material 84 are to be provided along may be performed arbitrarily according to manufacturing processes.

Operation of Semiconductor Memory Device in Accordance with Fourth Embodiment

Operation of the semiconductor memory device in accordance with the present embodiment formed as above can be executed similarly to operation in the first embodiment shown in FIGS. 4A-5B.

During the read operation, the read word line 83 corresponding to a selected one of the memory cells MC aligned in series in the bit line direction, that is, one subject to data read, is applied with the voltage Vsense (negative voltage) via the array word line 87. The read word line 83 corresponding to an unselected memory cell MC not subject to data read is applied with the voltage Vpass (positive high voltage) via the array word line 87. Moreover, the bit line 82 has its one end applied with the operating voltage Vop and its other end applied with the ground voltage Vs, so that a certain current flows in the bit line 82 during the read operation. Detecting a current flowing in the bit line 82 during the read operation allows the resistance state of the selected memory cell MC to be detected.

In addition, during the write/erase operations, a selected write/erase word line 81 connected to a selected memory cell MC is applied with the operating voltage Vop via the array word line 86. A selected bit line 82 connected to the selected memory cell MC is applied with the ground voltage Vs. In addition, an unselected write/erase word line 81 is applied with the ground voltage Vs via the array word line 86, and an unselected bit line 82 is applied with the operating voltage Vop. The operating voltage Vop is set to a setting voltage Vset during the setting operation, and is set to a resetting voltage Vreset during the resetting operation. This voltage application allows the write/erase operations to be executed.

Advantages of Semiconductor Memory Device in Accordance with Fourth Embodiment

The semiconductor memory device of the present embodiment also does not require a current to be passed directly through the resistance varying material 84 during the read operation. It is thereby possible to suppress occurrence of so-called read disturb, where a current flowing in the resistance varying material 84 during the read operation causes the resistance state of the resistance varying material 84 to change unintentionally. As a result, data can be read accurately from the selected memory cell MC.

Furthermore, even when the memory cell array 41 is configured three-dimensionally, the write/erase word lines 81, read word lines 83, and bit lines 82 to be applied with voltages can be individually selected, thereby allowing current flowing in unnecessary parts of the memory cell array 41 to be significantly reduced. This enables a reduction in power consumption and increase in operating margin to be achieved.

Method of Manufacturing Semiconductor Memory Device in Accordance with Fourth Embodiment FIGS. 16-24 are perspective views showing a method of manufacturing the memory cell array 41 in accordance with the present embodiment.

Figure 16:
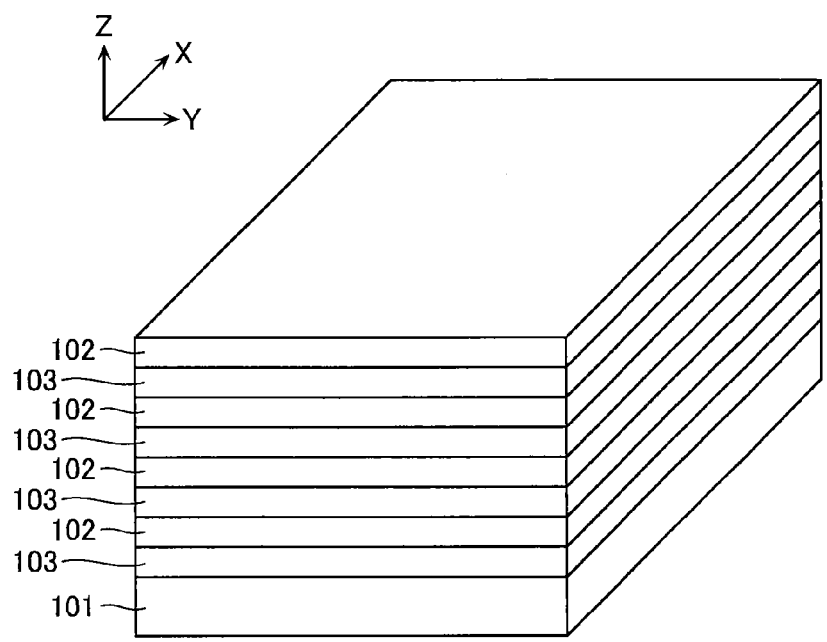
FIG. 16 is a perspective view explaining a method of manufacturing the memory cell array in the semiconductor memory device in accordance with the fourth embodiment.

First, as shown in FIG. 16, a CVD method is used to stack an interlayer insulating film 103 configured from SiO$_2$, and a silicon (Si) film 102 including a high concentration impurity, alternately, on one surface of a silicon substrate 101 (semiconductor substrate). After performing subsequent processing steps, this silicon film 102 becomes the bit line 82 shown in FIGS. 14 and 15. Therefore, a sufficient number of the silicon films 102 (four layers in the present embodiment) are stacked to correspond to the number of bit lines 82 formed in a Z direction perpendicular to the silicon substrate 101.

Figure 17:
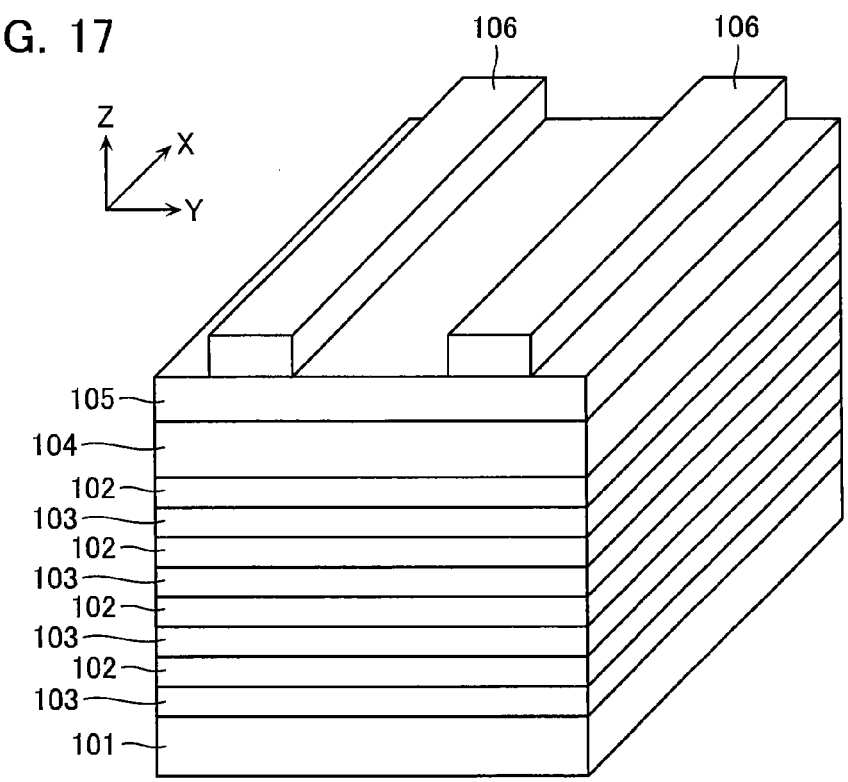
FIG. 17 is a perspective view explaining the method of manufacturing the memory cell array in the semiconductor memory device in accordance with the fourth embodiment.

As shown in FIG. 17, an etching mask 106 is stacked interposing an insulating film 104 and an insulating film 105 therebetween. A resist pattern is formed on the etching mask 106 using a photo etching process. Patterning of the etching mask 106 is performed by reactive ion etching with the resist pattern as a mask. The etching mask 106 is formed so as to extend in an X direction and be multiply aligned in a Y direction.

Figure 18:
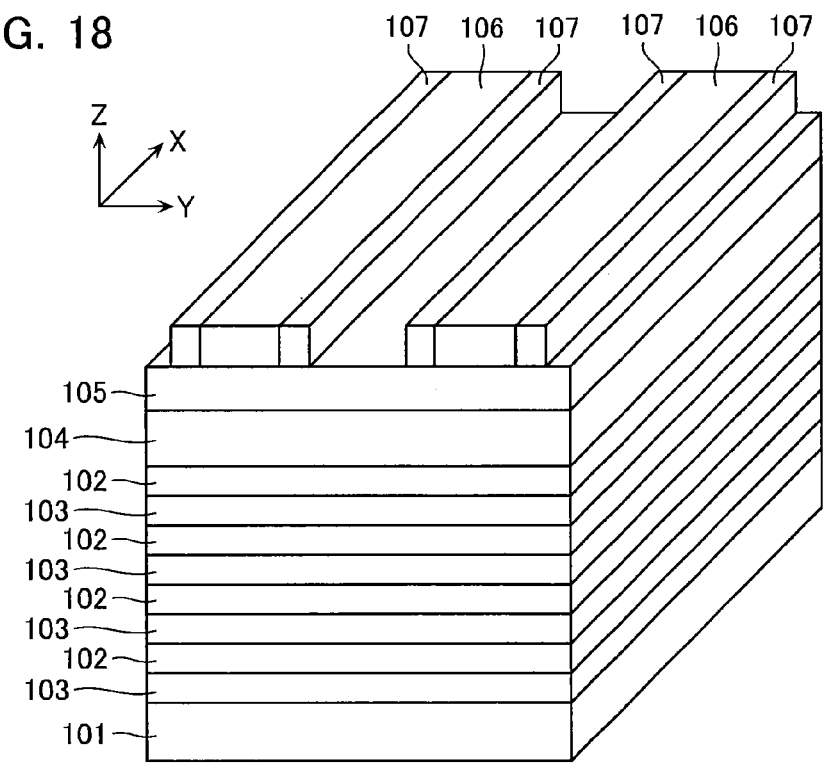
FIG. 18 is a perspective view explaining the method of manufacturing the memory cell array in the semiconductor memory device in accordance with the fourth embodiment.

Next, as shown in FIG. 18, a mask material is deposited on the insulating film 105 and the etching mask 106, and then etching-back is performed. This etching-back causes a side wall mask 107 to be formed that extends along a Y direction side wall of the etching mask 106.

Figure 19:
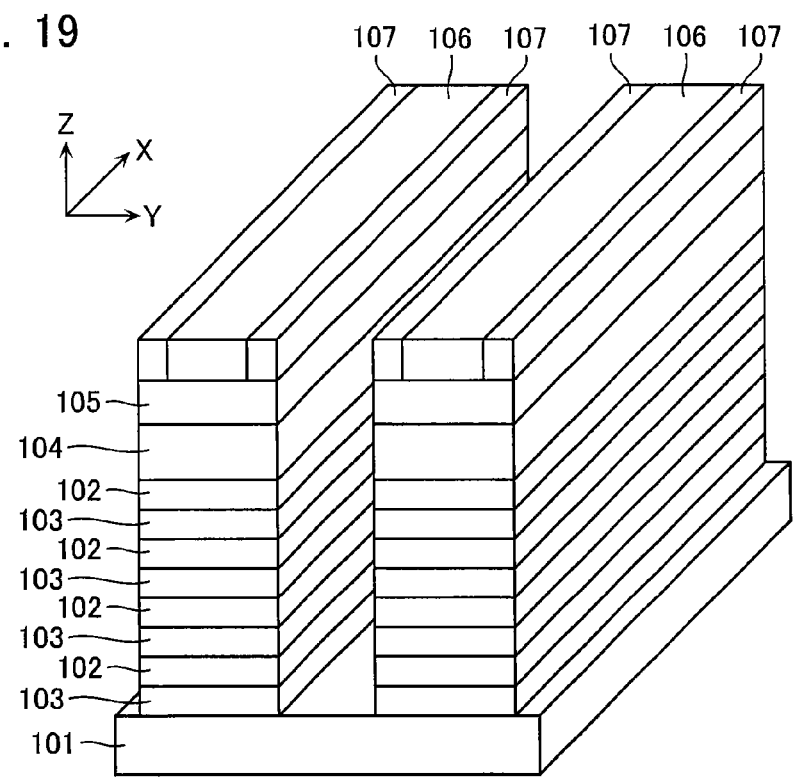
FIG. 19 is a perspective view explaining the method of manufacturing the memory cell array in the semiconductor memory device in accordance with the fourth embodiment.

Next, as shown in FIG. 19, the interlayer insulating film 103 and the silicon film 102 are etched by reactive ion etching with the etching mask 106 and the side wall mask 107 as a mask. This etching reaches the silicon substrate 101 and is performed until a surface of the silicon substrate 101 is exposed.

Figure 20:
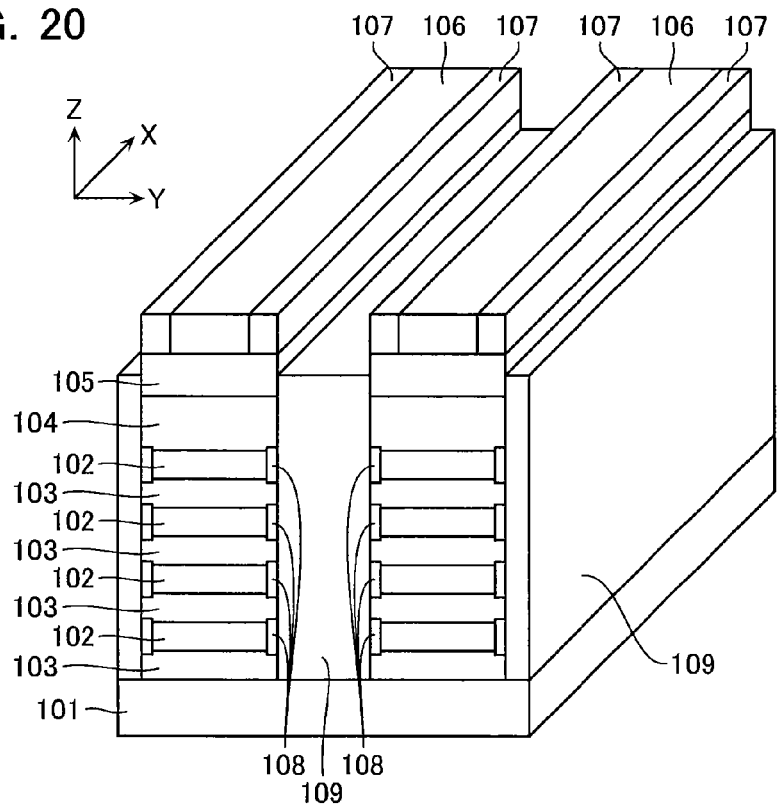
FIG. 20 is a perspective view explaining the method of manufacturing the memory cell array in the semiconductor memory device in accordance with the fourth embodiment.

Next, as shown in FIG. 20, a side surface of the silicon film 102 exposed due to etching is oxidized to form an insulating film 108. After performing subsequent processing steps, this insulating film 108 becomes the insulating film 85 shown in FIGS. 14 and 15. Subsequently, a silicon (Si) film 109 including a high concentration impurity is deposited on the silicon substrate 101 so as to fill between the silicon films 102. After performing subsequent processing steps, this silicon film 109 becomes the read word line 83 shown in FIGS. 14 and 15. The silicon film 109 is connected to a diffusion layer line (not shown) provided beforehand in the silicon substrate 101.

Figure 21:
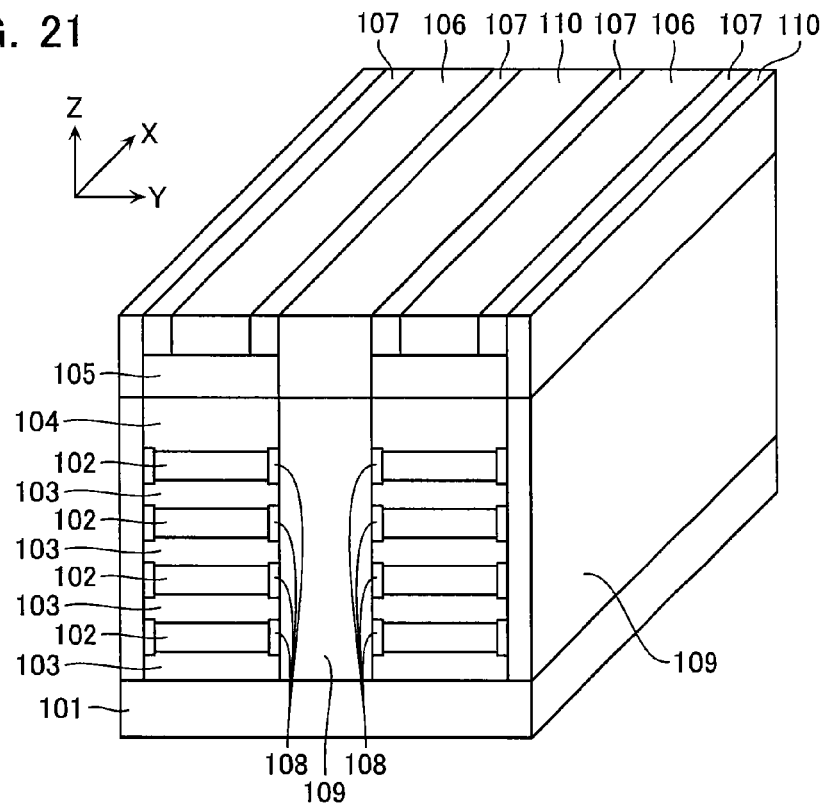
FIG. 21 is a perspective view explaining the method of manufacturing the memory cell array in the semiconductor memory device in accordance with the fourth embodiment.

Next, as shown in FIG. 21, an etching mask 110 to be used in a subsequent etching process is deposited on the silicon film 109. Subsequently, the etching mask 110, the etching mask 106, and the side wall mask 107 are planarized by CMP (Chemical Mechanical Polishing).

Figure 22:
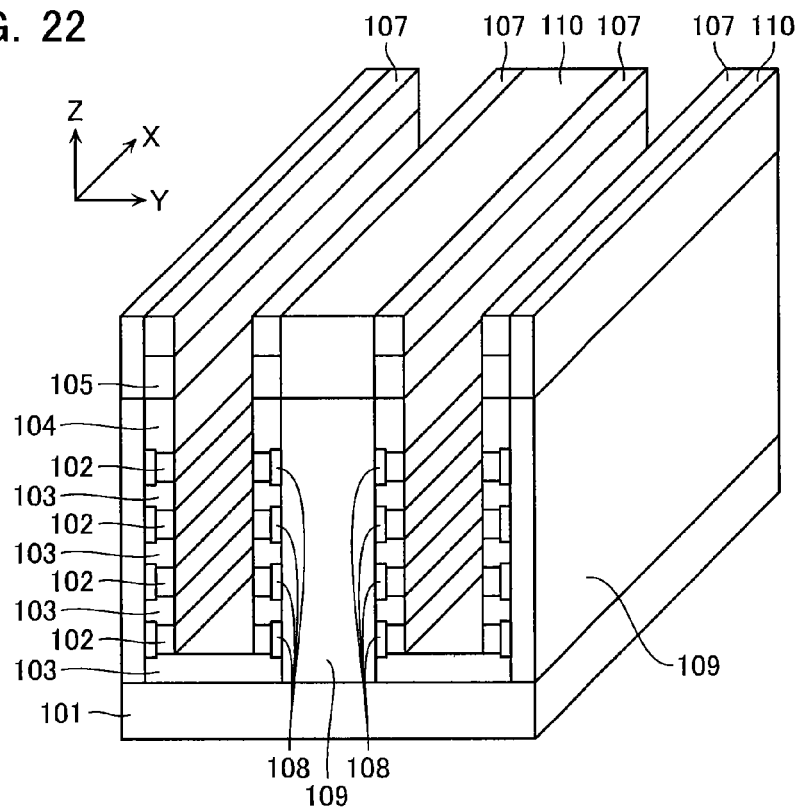
FIG. 22 is a perspective view explaining the method of manufacturing the memory cell array in the semiconductor memory device in accordance with the fourth embodiment.

Next, as shown in FIG. 22, the etching mask 106 only is removed. Subsequently, the interlayer insulating film 103 and the silicon film 102 are etched by reactive ion etching with the etching mask 110 and the side wall mask 107 as a mask. This etching is performed so as not to reach to the silicon substrate 101, but to leave a lowermost layer of the interlayer insulating film 103 remaining.

Figure 23:
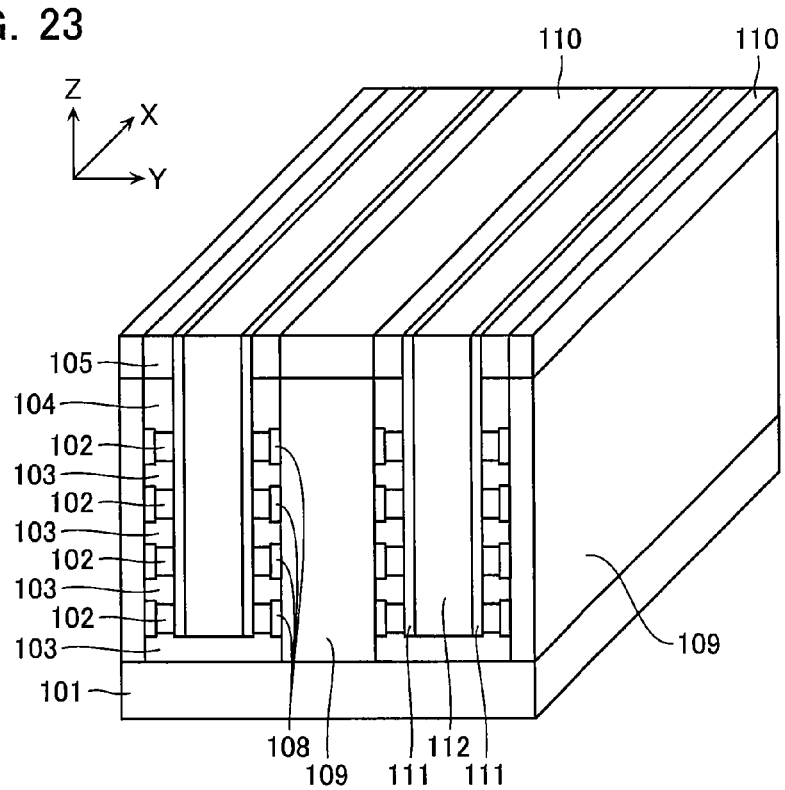
FIG. 23 is a perspective view explaining the method of manufacturing the memory cell array in the semiconductor memory device in accordance with the fourth embodiment.

Next, as shown in FIG. 23, a resistance varying material 111 is formed on the side surface of the silicon film 102 exposed due to etching. Subsequently, a silicon (Si) film 112 including a high concentration impurity is deposited so as to fill between the resistance varying material 111. After performing subsequent processing steps, this silicon film 112 becomes the write/erase word line 81 shown in FIGS. 14 and 15. The silicon film 112 is insulatingly isolated from the silicon substrate 101 having the diffusion layer line formed therein by the lowermost layer of the interlayer insulating film 103. Subsequently, CMP is used to planarize the silicon film 112 and remove the etching mask 107.

Figure 24:
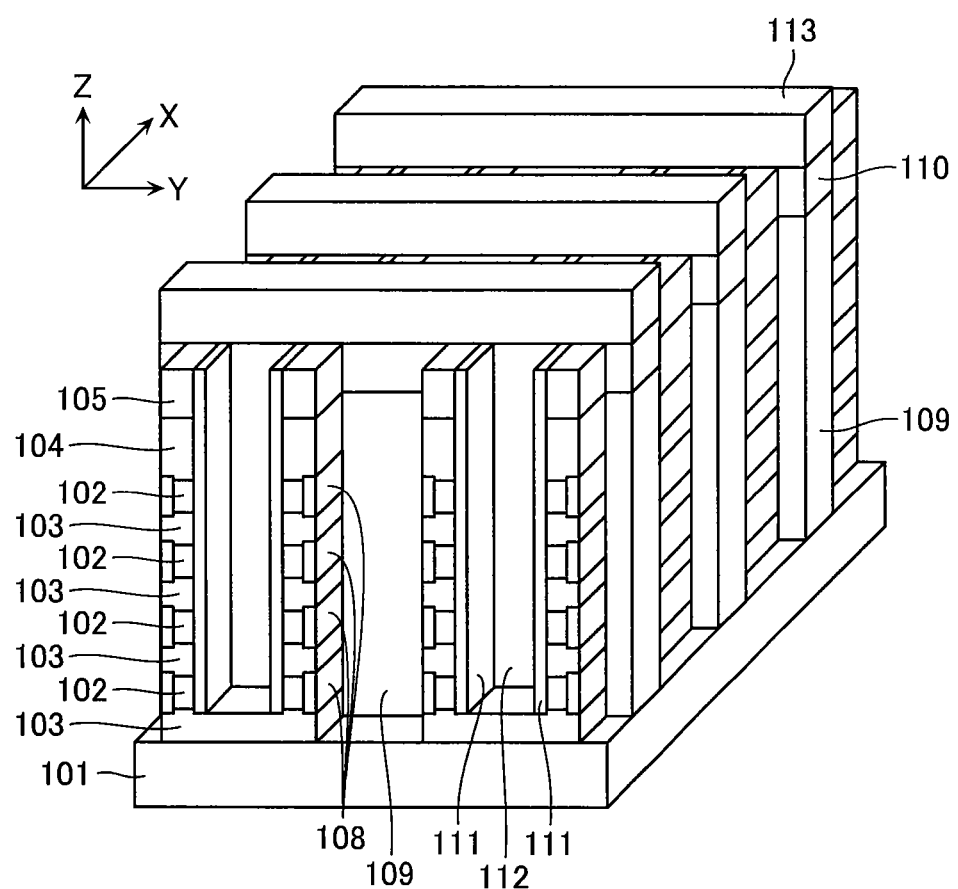
FIG. 24 is a perspective view explaining the method of manufacturing the memory cell array in the semiconductor memory device in accordance with the fourth embodiment.

Next, as shown in FIG. 24, a metal film and an etching mask are deposited overall, and then a resist pattern is formed on the etching mask using a photo etching process. Patterning of the etching mask is performed by reactive ion etching with the resist pattern as a mask. The etching mask is formed so as to extend in the Y direction and be multiply aligned in the X direction. The metal film and the silicon film are etched by reactive ion etching with the etching mask as a mask. This etching causes the silicon film to be separated such that a plurality of write/erase word lines are aligned in the X direction. Moreover, an etched metal wiring 113 becomes the array word line 86 shown in FIGS. 14 and 15. Note that the metal wiring 113 is insulatingly isolated from the silicon film 109 by the etching mask 110.

The semiconductor memory device of the present embodiment can be manufactured as described above. In the above-described method of manufacture, the photo etching process is performed twice, whereby a rise in lithography processing costs can be suppressed. In addition, the silicon film 109 (read word line 83) and the silicon film 112 (write/erase word line 81) formed alternately between the silicon films 102 (bit lines 82) are formed in openings. The openings are etched by using, as a mask, the etching masks 106 and 110 formed alternately between the side wall masks 107. If a photo etching process is performed multiple times when manufacturing the read word lines 83 and write/erase word lines 81, misalignment may easily occur, and there is a risk that dispersions arise in performance of the manufactured read word lines 83, write/erase word lines 81, memory cells MC, and so on. However, the above-described method of manufacture has alignment of the read word lines 83 and write/erase word lines 81 performed without the side wall mask 107 being removed, thereby allowing misalignment and dispersion in line width to be suppressed.

This concludes description of the embodiments of the present invention, but it should be noted that the present invention is not limited to the above-described embodiments, and that various alterations, additions, combinations, and so on, are possible within a range not departing from the scope and spirit of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a semiconductor substrate;
   a plurality of first word lines extending in a stacking direction perpendicular to the semiconductor substrate, the first word lines being arranged having a certain pitch in a first direction parallel to a surface of the semiconductor substrate and being arranged having a certain pitch in a second direction parallel to the surface of the semiconductor substrate and orthogonal to the first direction;
   a plurality of bit lines extending in the first direction and arranged having a certain pitch in the second direction and the stacking direction, the bit lines being configured to intersect the first word lines such that a first surface of the bit lines faces the first word lines;
   a resistance varying material disposed at respective intersections of the first word lines and the bit lines;
   a plurality of second word lines extending in the stacking direction and arranged having a certain pitch in the first direction and the second direction, the second word lines being configured to intersect the bit lines so as to face a second surface of the bit lines, the second surface of the bit lines being on an opposite side of the first surface of the bit lines; and an insulating film disposed at respective intersections of the second word lines and the bit lines, the first word lines and the second word lines being disposed alternately in the second direction so as to sandwich the bit lines, the second word lines, the bit lines, and the insulating film configuring a field-effect transistor at respective intersections of the second word lines and the bit lines, the field-effect transistor having one of the second word lines as a control electrode and one of the bit lines as a channel region, and the field-effect transistor and the resistance varying material configuring one memory cell.

2. The semiconductor memory device according to claim 1, wherein the resistance varying material is disposed along a side surface of the first word lines, and the insulating film is disposed along a side surface of the second word lines.

3. The semiconductor memory device according to claim 1, wherein the resistance varying material is disposed along a side surface of the first word lines, and the insulating film is disposed along a side surface of the bit lines.

4. The semiconductor memory device according to claim 1, further comprising:

a second word line decoder configured to select the second word lines;

a bit line decoder configured to select the bit lines;

a power source unit configured to apply a certain read voltage to a selected one of the second word lines selected by the second word line decoder and to unselected second word lines not selected by the second word line decoder, and to apply a certain voltage to a selected one of the bit lines selected by the bit line decoder; and a data read unit configured to detect a current flowing in the selected one of the bit lines, thereby detecting, as data, a resistance state of the resistance varying material of the memory cell configured at an intersection of the selected one of the second word lines and the selected one of the bit lines.

5. The semiconductor memory device according to claim 4, wherein the resistance varying material is formed by a material in which a change in a resistance state occurs due to presence/absence of a charge trapped in a charge trap existing in the resistance varying material or at an interface, and the power source unit applies a first voltage to the unselected second word lines and a second voltage to the selected one of the second word lines, the first voltage being a voltage at which the selected one of the bit lines maintains a conductive state regardless of a resistance state of the resistance varying material, and the second voltage being a voltage at which the conductive/non-conductive state of the selected one of the bit lines changes depending on the resistance state of the resistance varying material.

6. The semiconductor memory device according to claim 1, further comprising:

a first word line decoder configured to select the first word lines;

a bit line decoder configured to select the bit lines;

a power source unit configured to apply a certain write voltage or erase voltage to a selected one of the first word lines selected by the first word line decoder and to unselected first word lines not selected by the first word line decoder, and to apply a certain voltage to a selected one of the bit lines selected by the bit line decoder; and a data write/erase unit configured to control a write/erase operation for changing a resistance state of the resistance varying material of the memory cell configured at an intersection of the selected one of the first word lines and the selected one of the bit lines.

7. The semiconductor memory device according to claim 1, wherein the bit lines are formed by a semiconductor material including an impurity with an impurity concentration lower than that of the first word lines and the second word lines.

8. A semiconductor memory device, comprising:

a semiconductor substrate;

a plurality of first word lines extending in a stacking direction perpendicular to the semiconductor substrate, the first word lines being arranged having a certain pitch in a first direction parallel to a surface of the semiconductor substrate and being arranged having a certain pitch in a second direction parallel to the surface of the semiconductor substrate and orthogonal to the first direction;

a plurality of bit lines extending in the first direction and arranged having a certain pitch in the second direction and the stacking direction, the bit lines being configured to intersect the first word lines such that a first surface of the bit lines faces the first word lines;

a resistance varying material disposed at respective intersections of the first word lines and the bit lines;

a plurality of second word lines extending in the stacking direction and arranged having a certain pitch in the first direction and the second direction, the second word lines being configured to intersect the bit lines so as to face a second surface of the bit lines, the second surface of the bit lines being on an opposite side of the first surface of the bit lines;

an insulating film disposed at respective intersections of the second word lines and the bit lines;

a plurality of first array word lines extending in the second direction and arranged having a certain pitch in the first direction, the first array word lines being connected to ends of upper portions of the plurality of first word lines; and a plurality of second array word lines extending in the second direction and arranged having a certain pitch in the first direction, the second array word lines being connected to ends of lower portions of the plurality of second word lines, the first word lines and the second word lines being disposed alternately in the second direction so as to sandwich the bit lines, the second word lines, the bit lines, and the insulating film configuring a field-effect transistor at respective intersections of the second word lines and the bit lines, the field-effect transistor having one of the second word lines as a control electrode and one of the bit lines as a channel region, and the field-effect transistor and the resistance varying material configuring one memory cell.

9. The semiconductor memory device according to claim 8, wherein
the resistance varying material is disposed along a side surface of the first word lines, and
the insulating film is disposed along a side surface of the second word lines.

10. The semiconductor memory device according to claim 8, wherein
the resistance varying material is disposed along a side surface of the first word lines, and
the insulating film is disposed along a side surface of the bit lines.

11. The semiconductor memory device according to claim 8, further comprising:
a second word line decoder configured to select the second word lines;
a bit line decoder configured to select the bit lines;
a power source unit configured to apply a certain read voltage to a selected one of the second word lines selected by the second word line decoder and to unselected second word lines not selected by the second word line decoder via the second array word lines, and to apply a certain voltage to a selected one of the bit lines selected by the bit line decoder; and
a data read unit configured to detect a current flowing in the selected one of the bit lines, thereby detecting, as data, a resistance state of the resistance varying material of the memory cell configured at an intersection of the selected one of the second word lines and the selected one of the bit lines.

12. The semiconductor memory device according to claim 11, wherein
the resistance varying material is formed by a material in which a change in a resistance state occurs due to presence/absence of a charge trapped in a charge trap existing in the resistance varying material or at an interface, and
the power source unit applies a first voltage to the unselected second word lines and a second voltage to the selected one of the second word lines, the first voltage being a voltage at which the selected one of the bit lines maintains a conductive state regardless of a resistance state of the resistance varying material, and the second voltage being a voltage at which the conductive/non-conductive state of the selected one of the bit lines changes depending on the resistance state of the resistance varying material.

13. The semiconductor memory device according to claim 8, further comprising:
a first word line decoder configured to select the first word lines;
a bit line decoder configured to select the bit lines;
a power source unit configured to apply a certain write voltage or erase voltage to a selected one of the first word lines selected by the first word line decoder and to unselected first word lines not selected by the first word line decoder via the first array word lines, and to apply a certain voltage to a selected one of the bit lines selected by the bit line decoder; and
a data write/erase unit configured to control a write/erase operation for changing a resistance state of the resistance varying material of the memory cell configured at an intersection of the selected one of the first word lines and the selected one of the bit lines.

* * * * *